(12) United States Patent
Tanwani et al.

(10) Patent No.: US 12,270,841 B2
(45) Date of Patent: *Apr. 8, 2025

(54) METER FOR USE WITH A DISTRIBUTED ENERGY RESOURCE

(71) Applicant: Landis+Gyr Innovations, Inc., Alpharetta, GA (US)

(72) Inventors: Nikhil Tanwani, Delhi (IN); Bahadur Singh Rathore, Noida (IN); Matthew Donald Karlgaard, Brainerd, MN (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 406 days.

This patent is subject to a terminal disclaimer.

(21) Appl. No.: 17/811,566

(22) Filed: Jul. 8, 2022

(65) Prior Publication Data

US 2024/0012037 A1 Jan. 11, 2024

(51) Int. Cl.
G01R 22/06 (2006.01)
H02J 3/38 (2006.01)

(52) U.S. Cl.
CPC ............ G01R 22/065 (2013.01); H02J 3/381 (2013.01); *H02J 2300/20* (2020.01)

(58) Field of Classification Search
CPC ...... H02J 3/381; H02J 2300/20; G01R 22/065
USPC ....................................................... 439/519
See application file for complete search history.

(56) References Cited

U.S. PATENT DOCUMENTS 11,215,650 B2  1/2022  Cook
11,237,194 B2  2/2022  Tanwani et al.
11,835,556 B2 * 12/2023  Tanwani .............. H02H 1/0007
2022/0113339 A1  4/2022  Tanwani et al.

FOREIGN PATENT DOCUMENTS

| AU | 2020206320 A1 | 7/2021 |
| AU | 2020283031 A1 | 1/2022 |
| AU | 2020363385 A1 | 5/2022 |
| WO | 2021/071717 A1 | 4/2021 |

OTHER PUBLICATIONS

PCT Patent Application No. PCT/US2023/027064, International Search Report and Written Opinion, Nov. 15, 2023, 6 pages.

* cited by examiner

*Primary Examiner* — Gary F Paumen
(74) *Attorney, Agent, or Firm* — Kilpatrick Townsend & Stockton LLP

(57) ABSTRACT

An electricity meter includes: a plurality of first electrical metrology components including a first load busbar, a first line current transducer positioned around the first load busbar, a first DER busbar, and a first DER current transducer positioned around the first DER busbar; and a plurality of second electrical metrology components including a second load busbar, a second line current transducer positioned around the second load busbar, a second DER busbar, and a second DER current transducer positioned around the second DER busbar. The first electrical metrology components and the second electrical metrology components are arranged in the electricity meter so that the first electrical metrology components are positioned on a first side of the electricity meter and the second electrical metrology components are positioned on a second side of the electricity meter that is non-overlapping with the first side of the electricity meter.

23 Claims, 15 Drawing Sheets

METER FOR USE WITH A DISTRIBUTED ENERGY RESOURCE

TECHNICAL FIELD

This disclosure relates generally to an electricity meter. More particularly, this disclosure relates to an electricity meter for use with a distributed energy resource device.

BACKGROUND

Distributed energy resource (DER) devices, for example, solar panels, wind turbines, electric vehicle batteries, etc. are typically wired into the grid with a connection into a circuit breaker in an electrical panel within a customer's premises. If metering of the DER device is required, a separate meter is typically mounted on the customer's wall for this purpose. One or more disconnect switches are typically also mounted on the customer's wall.

There is an increase in the use of DER devices by energy consumers, including residential consumers. Currently, when a consumer wants to connect a DER device at a premises, a utility and an electrician installing the DER device must coordinate and be on the premises at the same time. The utility disconnects the power to the meter socket. After the power is disconnected, the electrician connects the DER device "behind the meter." In some installations, a separate meter for the DER device may be required. After the DER device is installed, the utility re-connects the power to the meter socket. A system for connecting a DER device to an existing utility service without coordination between the utility and the electrician is desirable.

SUMMARY

Systems for connecting distributed energy resource devices with distributed energy resource meters are provided.

According to various aspects there is provided an electricity meter. In some aspects, the electricity meter may include: a first set of connection paths configured to couple to a meter socket and electrically coupled to a first electrical connection path between a first phase of an electric distribution power source, a first phase of a distributed energy resource (DER) device, and a first phase of a load, wherein the first electrical connection path includes first electrical metrology components; and a second set of connection paths configured to couple to the meter socket and electrically coupled to a second electrical connection path between a second phase of the electric distribution power source, a second phase of the DER device, and a second phase of the load, wherein the second electrical connection path includes second electrical metrology components.

The first electrical metrology components and the second electrical metrology components are arranged in the electricity meter such that: at least one of the first electrical metrology components is positioned on a first surface of a support structure on a first side of the electricity meter and at least one other of the first electrical metrology components is positioned on a second surface of the support structure opposite the first surface on the first side of the electricity meter, and at least one of the second electrical metrology components is positioned on the first surface of the support structure on a second side of the electricity meter and at least one other of the second electrical metrology components is positioned on the second surface of the support structure opposite the first surface on the second side of the electricity meter. The second side of the electricity meter is non-overlapping with the first side of the electricity meter.

According to various aspects there is provided an electricity meter. In some aspects, the electricity meter may include: a plurality of first electrical metrology components including a first load busbar, a first line current transducer positioned around the first load busbar, a first DER busbar, and a first DER current transducer positioned around the first DER busbar; and a plurality of second electrical metrology components including a second load busbar, a second line current transducer positioned around the second load busbar, a second DER busbar, and a second DER current transducer positioned around the second DER busbar.

The first electrical metrology components and the second electrical metrology components are arranged in the electricity meter so that the first electrical metrology components are positioned on a first side of the electricity meter and the second electrical metrology components are positioned on a second side of the electricity meter that is non-overlapping with the first side of the electricity meter.

According to various aspects there is provided an electricity meter. In some aspects, the electricity meter may include: a first electrical connection path that connects a first line mating connector, a first DER mating connector, and a first load mating connector, wherein the first electrical connection path includes a plurality of first electrical metrology components including a first line busbar, a first load busbar coupled to the first line busbar, a first line current transducer positioned around the first load busbar, a first DER busbar, and a first DER current transducer positioned around the first DER busbar; and a second electrical connection path that connects a second line mating connector, a second DER mating connector, and a second load mating connector, wherein the second electrical connection path includes a plurality of second electrical metrology components including a second line busbar, a second load busbar coupled to the second line busbar, a second line current transducer positioned around the second load busbar, a second DER busbar, and a second DER current transducer positioned around the second DER busbar.

The first electrical metrology components and the second electrical metrology components are arranged in the electricity meter so that the first electrical metrology components are positioned on a first side of the electricity meter and the second electrical metrology components are positioned on a second side of the electricity meter that is non-overlapping with the first side of the electricity meter.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE DRAWINGS

Aspects and features of the various embodiments will be more apparent by describing examples with reference to the accompanying drawings, in which.

DETAILED DESCRIPTION

While certain examples are described herein, these examples are presented by way of example only, and are not intended to limit the scope of protection. The apparatuses and systems described herein may be embodied in a variety of other forms. Furthermore, various omissions, substitutions, and changes in the form of the example methods and systems described herein may be made without departing from the scope of protection.

Systems are provided for connecting distributed energy resource (DER) devices with metering devices. Currently there is no standard system for connecting DER devices to the grid. Existing systems often rely on coordination between a utility that owns a utility metering device and an electrician installing the DER device. For example, the utility may be required to remove the utility metering device while the electrician is on premises to install the DER device. Upon installation of the DER device, the utility has to reinstall the utility metering device.

A DER meter is described herein that provides a mechanism to meter electricity originating from both a DER device and the utility. The DER meter may mate with a DER-enabled meter socket at a customer premises. For the purpose of this disclosure, a DER device is defined as any resource on an electric distribution system (i.e., a grid) that produces or stores electricity that can be provided to the distribution system, or any large load device such as electric vehicles (EVs), air conditioners, heat pumps, pool pumps, etc., that can be controlled to manage overall peak load of the distribution system. For example, the DER device may be a residential solar installation or a residential wind turbine installation, with or without local battery storage.

Figure 1:
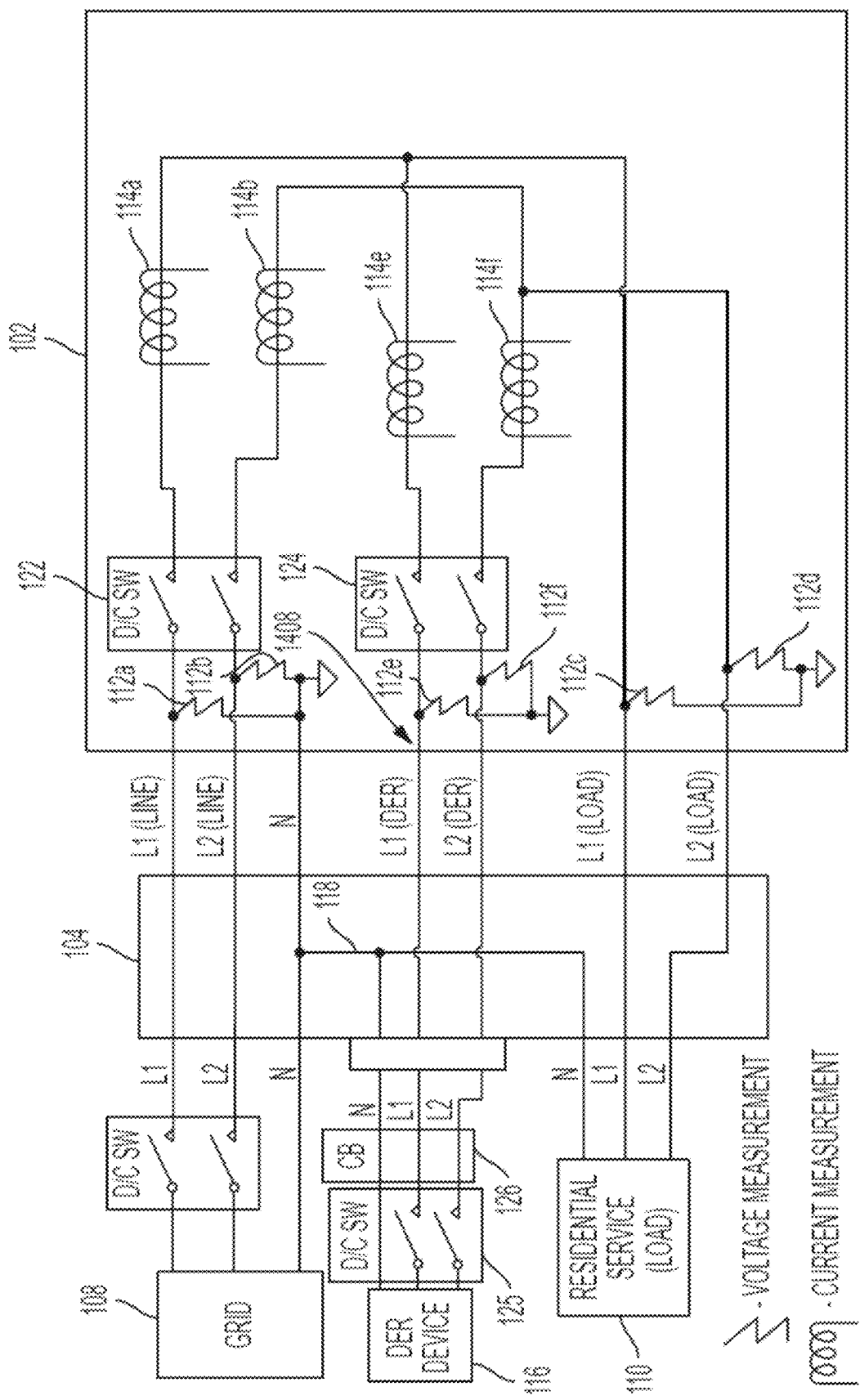
FIG. 1 is a simplified schematic diagram illustrating electrical connections between a distributed energy resource (DER) meter and a meter socket in accordance with various aspects of the present disclosure.

FIG. 1 is a simplified schematic diagram 100 illustrating electrical connections between a distributed energy resource (DER) meter 102 and a meter socket 104 in accordance with various aspects of the present disclosure. The DER meter 102 and the meter socket 104 are located at a customer premises (e.g., a residential building, a commercial building, etc.). The DER meter 102 measures and controls electricity delivered to the customer premises via an electric distribution system (i.e., a grid 108) and electricity generated or otherwise stored at the customer premises via a DER device (i.e., a DER device 116). Accordingly, the DER meter 102 includes sufficient connection points to receive electricity provided from the grid 108, to receive electricity provided from the DER device 116, and to provide electricity to an electrical service 110.

The DER meter 102 may be combined with a communications module to enable the DER meter 102 to communicate with other meters and with a utility. As illustrated in FIG. 1, power from the grid 108 (i.e., the electric distribution system) is supplied to the meter socket 104 through electrical wiring L1(Line) and L2(Line). Electrical wiring L1(Line) and L2(Line) may provide power from two phases of the grid 108. A neutral wire N, sometimes referred to as ground, is connected between the grid 108, the electrical service 110, and the DER device 116, for example, at an electrical service panel at a residential or commercial customer premises.

The electrical service or load 110 is also connected to the meter socket 104 via corresponding electrical wiring L1(Load) and L2(Load). The meter socket 104 may be a socket, such as a form 14S, 15S, or 16S meter socket, which includes electrical connectors to provide electrical connections to a conventional meter when a conventional meter is plugged into the meter socket 104. Other meter socket forms for the meter socket 104 are also contemplated. An electrical connection between the grid 108 and the electrical service 110 is formed through the DER meter 102 when the DER meter 102 is plugged into the meter socket 104. Within the DER meter 102, voltage and current provided by the grid 108 to the electrical service 110 is measured, or metered, by measuring devices. The measuring devices may be, for example, voltage transducers 112 and current transducers 114 that measure electrical characteristics of voltage and current waveforms, respectively. Power delivered to the electrical service 110 may be calculated based on the voltage and current measurements.

Output wirings from the DER device 116 may also be connected at connection points within the meter socket 104. A neutral wire N connection 118 may be formed at a connection point within the meter socket 104 to connect the neutral wires from the grid 108, the DER device 116, the electrical service 110, and the DER meter 102. In one or more examples, the connection points for the DER device 116 may be positioned on a side 120 of the meter socket 104. For example, the side 120 of the meter socket 104 may be any side of the meter socket 104 that does not interface with the DER meter 102 (e.g., a side that is exposed while the meter socket 104 is coupled to the DER meter 102). Positioning the connection points on the side 120 may provide an easily accessible location for the DER device 116 to connect with the meter socket 104.

The connection points within the meter socket 104 may provide electrical connections between the meter socket 104 and the DER meter 102. For example, the connection points for the lines L1(Line) and L2(Line) at the meter socket 104 from the grid 108 may electrically connect the lines L1(Line) and L2(Line) from the grid 108 to the DER meter 102. Similarly, the lines L1 and L2 from the DER device 116 and the lines L1(Load) and L2(Load) to the electrical service 110 may be electrically connected to the DER meter 102 through the connection points within the meter socket 104. Similar to the lines L1(Line) and L2(Line) from the grid 108, the lines L1 and L2 from the DER device 116 may provide voltages having different electrical phases. Further, the connection point for the neutral wire N may also have an electrical connection in a corresponding receptacle of the meter socket 104.

The connection points (e.g., receptacles) included in the meter socket 104 may accommodate insertion of connecting components (e.g., blade connectors) on the DER meter 102 to form electrical connections between the meter socket 104 and the DER meter 102. Other electrical couplings are also contemplated between the meter socket 104, the DER device 116, and the DER meter 102. When the connecting components of the DER meter 102 are inserted into the receptacles of the meter socket 104, electrical connections may be formed between the DER meter 102 and the lines L1(Line) and L2(Line) from the grid 108, between the DER meter 102 and the lines L1 and L2 from the DER device 116, and between the DER meter 102 and the lines L1(Load) and L2(Load) to the electrical service 110. The connection points and connecting components (e.g., receptacles and blade connectors) may generally be referred to as mating connectors.

When the connecting components of the DER meter 102 are inserted into the receptacles of the meter socket 104, and when the connecting components of the DER device 116, the grid 108, and the electrical service 110 are inserted into the receptacles of the meter socket 104, an electrical connection may be formed between the neutral wire N and the DER meter 102. The electrical connection of the neutral wire N with the DER meter 102 may provide an electrical reference point to enable voltage measurements from L1(Line) to neutral and L2(Line) to neutral at the voltage transducers 112 within the DER meter 102. The ability to perform these voltage measurements at the DER meter 102 may allow for more advanced and higher fidelity metering than is possible with a standard 2S meter form, for example, which only has L1(Line) and L2(Line) connections available (i.e., no neutral N connection) and therefore can only measure line to line voltage (i.e., from L1(Line) to L2(Line)). The DER meter 102 may also perform current measurements on the L1(Line) and L2(Line) lines from the grid 108 using the current transducer 114a and 114b, and may perform current measurements on the L1(DER) and L2(DER) lines from the DER device 116 using the current transducers 114e and 114f. The current transducers and associated busbars may be referred to herein as metrology components. Current supplied to the load may be calculated from the current measurements on the L1(Line) and L2(Line) lines from the grid 108 and the current measurements on the L1(DER) and L2(DER) lines from the DER device 116. The following equations may be used:

$$I_{LOAD-L1} = -I_{LINE-L1} - I_{DER-L1} \quad \text{(Equation 1)}$$

$$I_{LOAD-L2} = -I_{LINE-L2} - I_{DER-L2} \quad \text{(Equation 2)}$$

where $I_{LOAD-L1}$ is a calculated current at L1(Load), $I_{Line-L1}$ is a measured current at L1(Line), $I_{DER-L1}$ is a measured current at L1(DER), $I_{LOAD-L2}$ is a calculated current at L2(Load), $I_{LINE-L2}$ is a measured current at L2(Line), and $I_{DER-L2}$ is a measured current at L2(DER).

The ability to perform L1(Line) to neutral and L2(Line) to neutral voltage measurements at the DER meter 102 as well as performing the current measurements at the DER meter 102 may enable implementation of various applications such as load disaggregation algorithms.

The lines L1(Line) and L2(Line) from the grid 108 may provide line voltages having different electrical phases. The different electrical phases may be generated by a local distribution transformer (e.g., a pole-mounted transformer located near the meter) or may be different electrical phases generated at a substation. Similarly, the lines L1 and L2 from the DER device 116 may provide line voltages having different electrical phases. The electrical phases of the line voltages on the lines L1 and L2 provided by the DER device 116 may be synchronized with the electrical phases of the line voltages on the lines L1(Line) and L2(Line) provided by the grid 108.

Embodiments of meter sockets and meters in accordance with the present disclosure may include more or fewer connection points or receptacles corresponding to different phases of line voltages. For example, when only one line voltage phase is connected (e.g., phase A) fewer connection points and receptacles may be included in the meter socket since connection points for additional phases (e.g., phase B and phase C) are not needed. Similarly, when three line voltage phases are connected (e.g., phases A, B, and C) additional connection points and receptacles may be included in the meter socket.

In an example, a disconnect switch 122 is included in the DER meter 102. In such an example, the disconnect switch 122 may remain open when the voltage transducers 112a and 112b do not detect a voltage from the grid 108. Further, the disconnect switch may be used as a mechanism to synchronize voltage phases from the DER device 116 with the grid 108. For example, the voltage transducers 112e and 112f may measure the voltage supplied by the DER device 116 while the voltage transducers 112a and 112b measure the voltage supplied by the grid 108 while the disconnect switch 122 is open. Upon reaching synchronization between the DER device 116 and the grid 108 during a synchronization operation, the disconnect switch 122 may close. Further, the disconnect switch 122 may disconnect the DER meter 102 from the L1(Line) and L2(Line) connections to the grid 108. The ability to disconnect the DER meter 102 from the grid 108 may enable "islanding," which involves disconnecting the DER meter 102 from the grid 108 and supplying power to the electrical service 110 only from the DER device 116. Voltage transducers 112c and 112d measure the L1(Load) and L2(Load) voltages, respectively.

The DER meter 102 may also include an integrated, controllable electrical disconnect switch 124 that disconnects or protects the DER device 116. In some example, a disconnect switch 125 between the DER device 116 and the socket 104 may also be included to disconnect or protect the DER device 116. Additionally, a circuit breaker 126 may be positioned between the DER device 116 and the socket 104 or within the DER meter 102. In an example, a single device may perform both functions of a circuit breaker and a separate electrical disconnect device to disconnect the lines L1 and L2 of the DER device 116 from the DER meter 102. In an example, the circuit breaker 126 may disconnect the DER device 116 from the DER meter 102 upon occurrence of an electrical fault. The circuit breaker 126 may be integrated into the DER meter 102. Additionally, the circuit breaker 126 may be controlled locally or remotely.

The controllable electrical disconnect switch 124 may be controlled by a processor (not shown) and a communications module (not shown) of the DER meter 102. The controllable electrical disconnect switch 124 may operate automatically to disconnect the DER device 116 from the grid 108, for example, when a high load is detected at voltage transducers 112e and 112f or when the electrical service or load 110 is disconnected from the meter. In some examples, the controllable electrical disconnect switch 124 may operate automatically to disconnect the DER device 116 from the grid 108 based on a command received from the DER meter 102 or another device.

The controllable electrical disconnect switch 124 may connect or disconnect the DER device 116 with the DER meter 102. In connecting the DER device 116 to the DER meter 102, the DER meter 102 may measure power production or consumption of the DER device 116 as a separate value to the energy consumed from or sent back to the electric distribution system (i.e., the grid 108) thereby providing billable data. The billable data (i.e., consumption from the grid 108 or production fed back to the grid 108) may be metered within the electricity meter using "net metering" or similar methods. Further, the controllable electrical disconnect switch 124 may connect or disconnect the DER device 116 from the grid 108 based on power production or consumption requirements of the grid 108 and the DER device 116. Moreover, the disconnect switch 124 may be used to electrically disconnect the DER device 116 from the DER meter 102 to enable a technician to repair the DER meter 102, install the DER meter 102, or to replace the DER meter 102.

In an example, the DER disconnect switch (i.e., the controllable electrical disconnect switch 124) and the line disconnect switch (i.e., the disconnect switch 122) may be implemented with a 4-position switch. The 4-position switch may enable the following: 1. connection of the grid 108, the DER device 116, and the electrical service (load) 110; 2. connection of the grid 108 and the electrical service 110, with the DER device 116 disconnected; 3. connection of the electrical service 110 and the DER device 116, with the grid 108 disconnected; and 4. disconnection of the grid 108, the DER device 116, and the electrical service 110. Advantages of using a 4-position switch instead of two 2-position switches include reducing the cost and size of the components needed to provide the switching functions.

The DER meter 102 may measure and control the electricity delivered to the electrical service 110 via the grid 108, the DER device 116, or both. The DER meter 102 may include a communications module (not shown) and a processor (not shown). The processor may be a microprocessor; however, embodiments in accordance with the present disclosure are not limited to such an implementation. For example, the processor may be a microprocessor, microcomputer, computer, microcontroller, programmable controller, or other programmable device. One of ordinary skill in the art will appreciate that other variations may be implemented without departing from the scope of the present disclosure.

The communications module may communicate via RF, cellular, PLC, or any other suitable communications technology. The communications module may receive communications via a network that include instructions for controlling the controllable electrical disconnect switch 124. The communications module may transmit information related to the operation of the meter and the measurements performed by the measurement devices in the meter to other devices on the network or to a central system. The communications module may also provide communication between the DER meter 102 and the DER device 116.

In accordance with various aspects of the present disclosure, where the DER device 116 includes some form of electricity generator (e.g., solar or wind electricity generation) or a storage device, the DER meter 102 may use information about the electric distribution system. The information may include real-time electricity pricing or other information to make decisions and to control the DER device 116. For example, the DER meter 102 may use information to determine whether the DER device 116 should send energy to the grid 108 (e.g., from solar or battery storage, where battery storage could include batteries within an electric vehicle or similar), whether the DER device 116 should consume energy from the grid 108 (e.g., to charge storage or allow large loads such as water heaters, pool pumps, etc. to run), whether the DER device 116 should disconnect from the grid 108 (e.g., not consume energy from the grid 108 or send energy to the grid 108), or any combination thereof. Appropriate control actions may be initiated by the DER meter 102 based on the determination. One or ordinary skill in the art will appreciate that the above examples of decisions and control are not exhaustive, and that other decisions and control operations may be performed without departing from the scope of the present disclosure.

Figure 2:
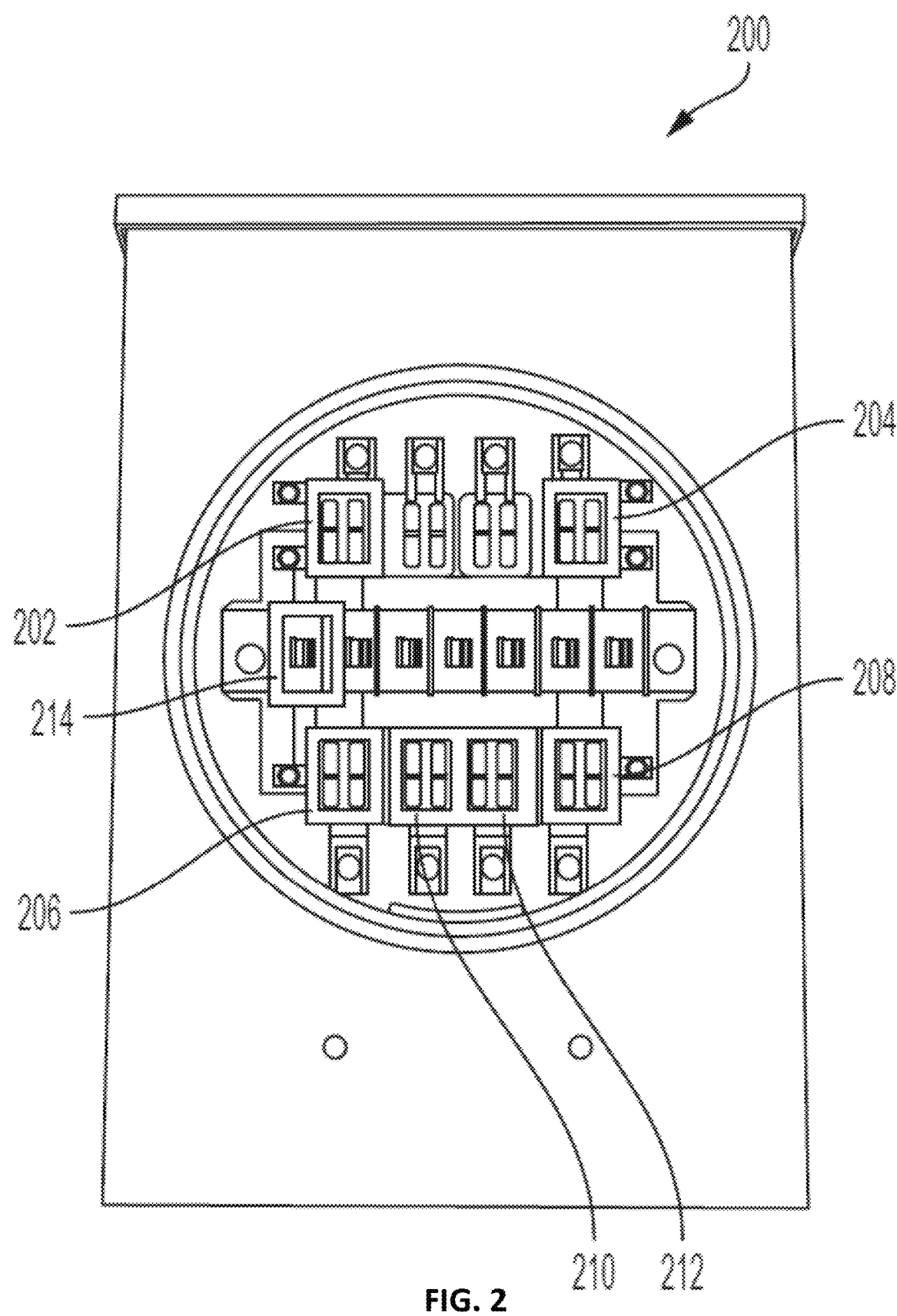
FIG. 2 is a front view of an example of a 15-terminal meter socket in accordance with various aspects of the present disclosure.

FIG. 2 is a front view of an example of a 15-terminal meter socket 200 in accordance with various aspects of the present disclosure. The illustrated meter socket 200 is a 16S meter socket. The meter socket 104, as depicted in FIG. 1, may be the 15-terminal meter socket 200. In an example, the 15-terminal meter socket 200 may be arranged to house multiple meter forms. For example, terminals 202 and 204 may be lines for the L1(Line) and L2(Line) described in FIG. 1 and electrically coupled to the grid 108. Terminals 206 and 208 may be lines for the L1(Load) and the L2(Load) described in FIG. 1 and electrically coupled to the electrical service 110. Terminals 210 and 212 may be lines for the L1(DER) and the L2(DER) described in FIG. 1 and electrically coupled to the DER device 116. In an example, terminal 214 may be electrically coupled to the neutral wire N described in FIG. 1.

Figure 3:
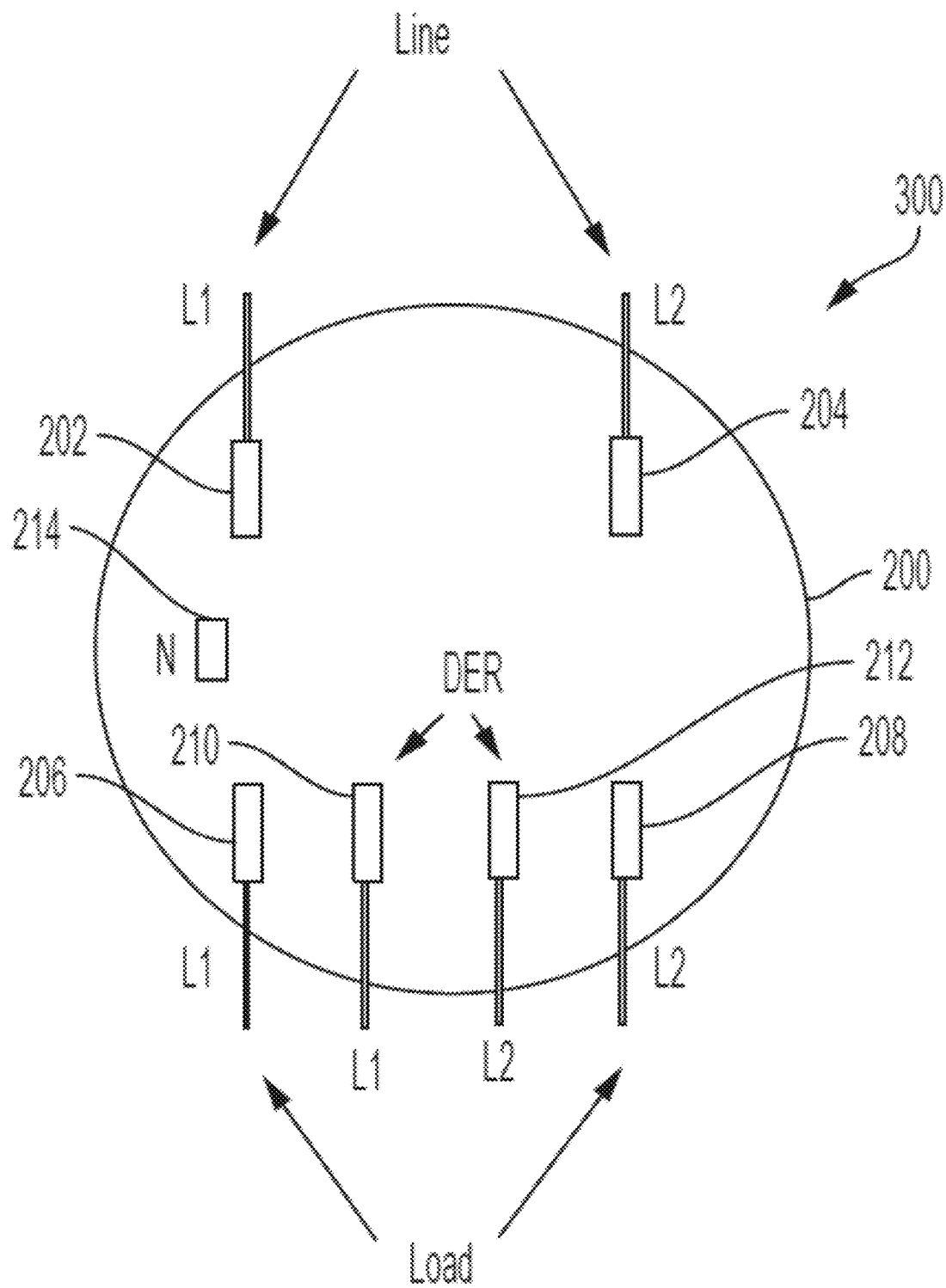
FIG. 3 is a diagram of terminals of the 15-terminal meter socket of FIG. 2 in accordance with various aspects of the present disclosure.

FIG. 3 is a diagram 300 of the terminals 202-214 of the 15-terminal meter socket 200 in accordance with various aspects of the present disclosure. The diagram 300 depicts how the terminals 202-214 of the meter socket 200 (e.g., a 16S meter socket) may be electrically coupled to the line (i.e., the grid 108), the load (i.e., the electrical service 110), the neutral wire N, and, once installed, the DER device 116.

Figure 4:
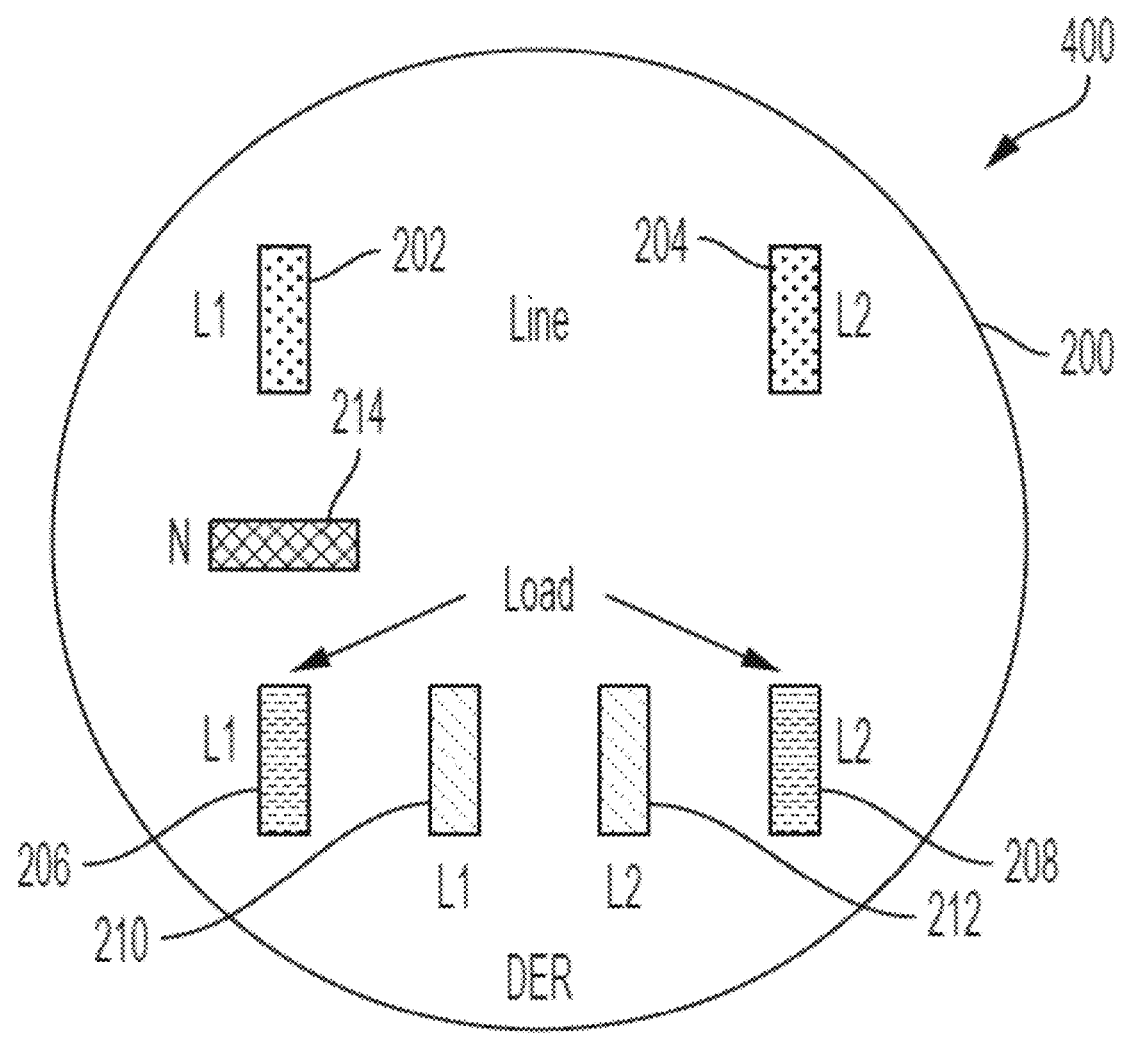
FIG. 4 is a diagram of a possible alternative configuration for a neutral terminal of the meter socket of FIG. 2 in accordance with various aspects of the present disclosure.

FIG. 4 is a diagram 400 of a possible alternative configuration for the neutral terminal 214 of the meter socket 200 in accordance with various aspects of the present disclosure. Other arrangements are also possible, including arrangements that vary which terminals 202-214 are used for the line, the load, the neutral wire N, and the DER device 116.

By providing alternative arrangements of the neutral wire N in the meter sockets 200 of FIGS. 3 and 4, the meter socket 200 may be incompatible with metering devices with an incompatible arrangement of connection blades. That is, a metering device, such as the DER meter 102, would need to be appropriately keyed to one of the meter sockets 200 in FIG. 3 or 4 or any other arrangement of the meter socket 200.

Figure 5:
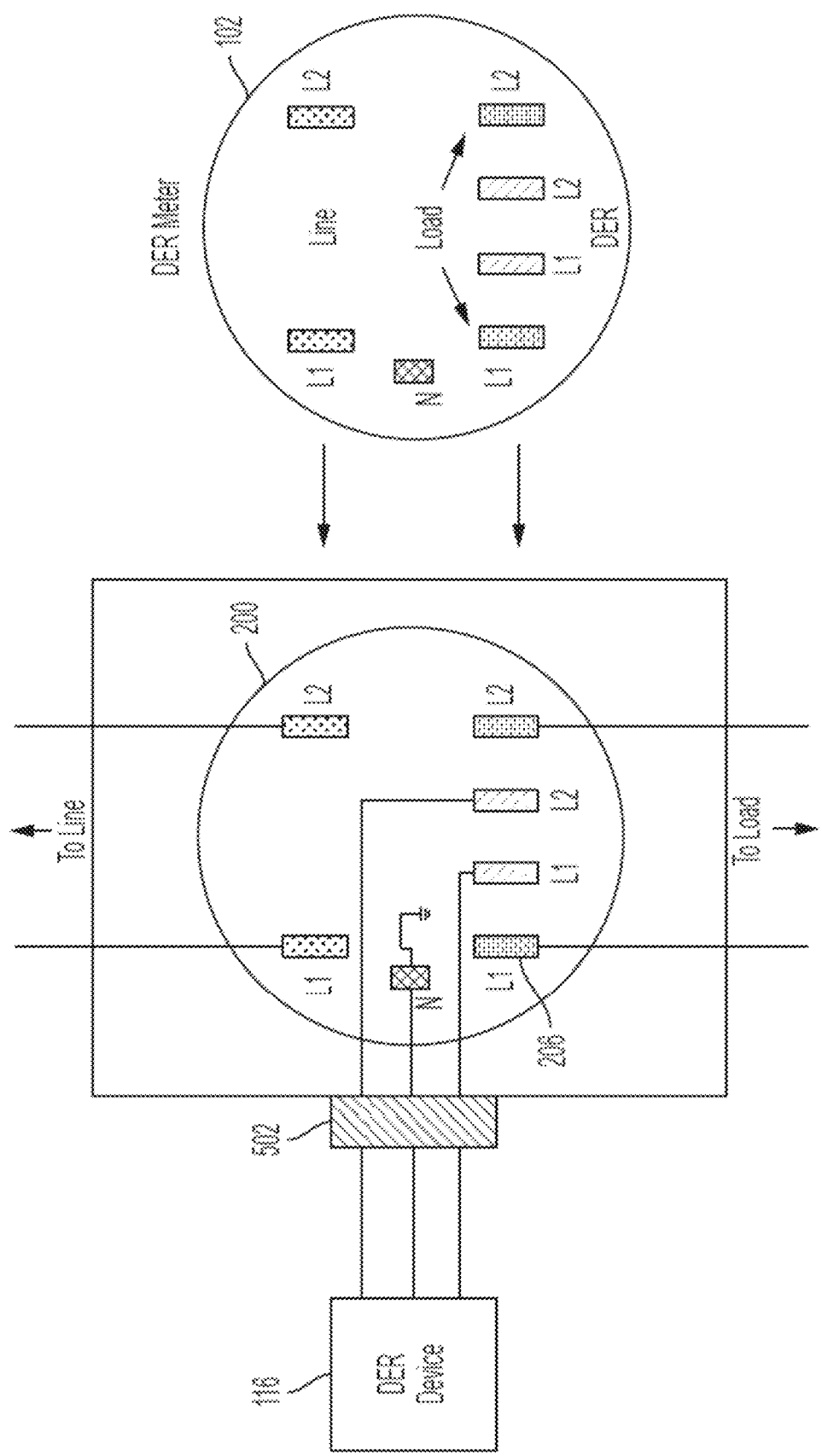
FIG. 5 is an example of a DER meter being installed in the meter socket of FIG. 2 in accordance with various aspects of the present disclosure.

FIG. 5 is an example of the DER meter 102 being installed in the DER-enabled meter socket 200 in accordance with various aspects of the present disclosure. In an example, the meter socket 200 includes an optional DER connector 502 on the side 120 of the meter socket 200 in accordance with various aspects of the present disclosure. The DER connector 502 may be added to the meter socket 200 to facilitate the quick and efficient connection of a DER device 116. The DER connector 502 may be integrated into the meter socket 200 or may be an optional add-on component.

To install the DER device 116 at a premises with existing service, an electrician connects the DER device 116 to the DER connector 502, and the utility replaces a traditional meter with the DER meter 102. The DER meter 102 is also referred to herein as a multi-port meter. The DER connector 502 and the meter socket 200 allow these steps to occur independently. The electrician and the utility do not need to coordinate in such an instance. The electrician may connect the DER device 116 to the DER connector before or after the utility replaces the traditional meter.

Figure 6:
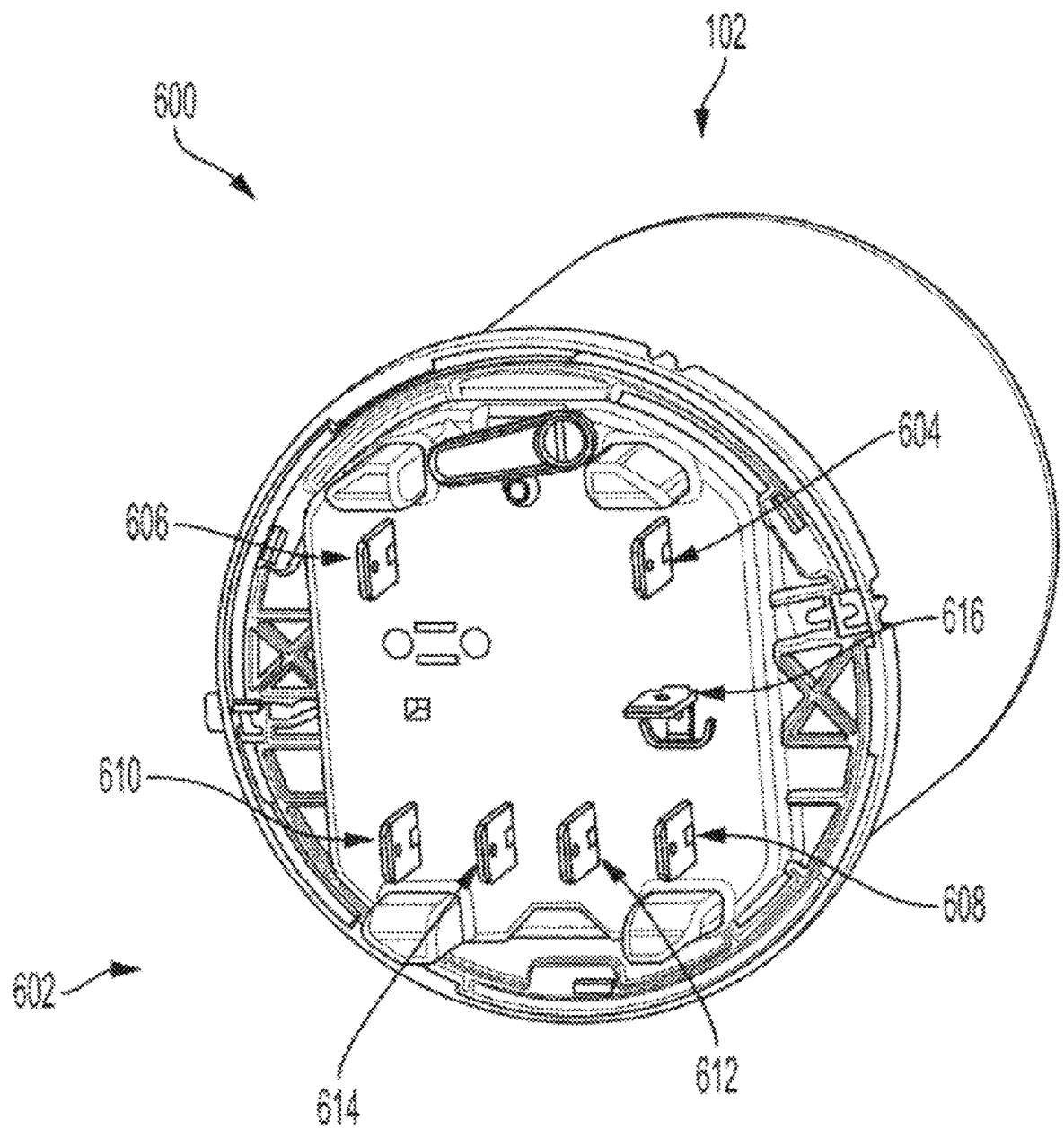
FIG. 6 is a perspective view of a blade portion of a DER meter in accordance with various aspects of the present disclosure.

FIG. 6 is a perspective view 600 of a blade portion 602 of the DER meter 102 in accordance with various aspects of the present disclosure. In an example, blades 604 and 606 electrically couple to L1(Line) and L2(Line) of the DER meter 102, respectively. Blades 608 and 610 couple to L1(Load) and L2(Load) of the DER meter 102, respectively. Blades 612 and 614 couple to L1(DER) and L2(DER) of the DER meter 102, respectively. Additionally, blade 616 couples to the neutral line N 1050 (see FIG. 10) of the DER meter 102. As discussed above with respect to FIG. 4, the blades 602-614 of the DER meter 102 may be keyed to fit within the corresponding terminals 202-214 of the socket 200 of FIG. 4. Other arrangements of the blades 602-614 are also contemplated.

Figure 7A:
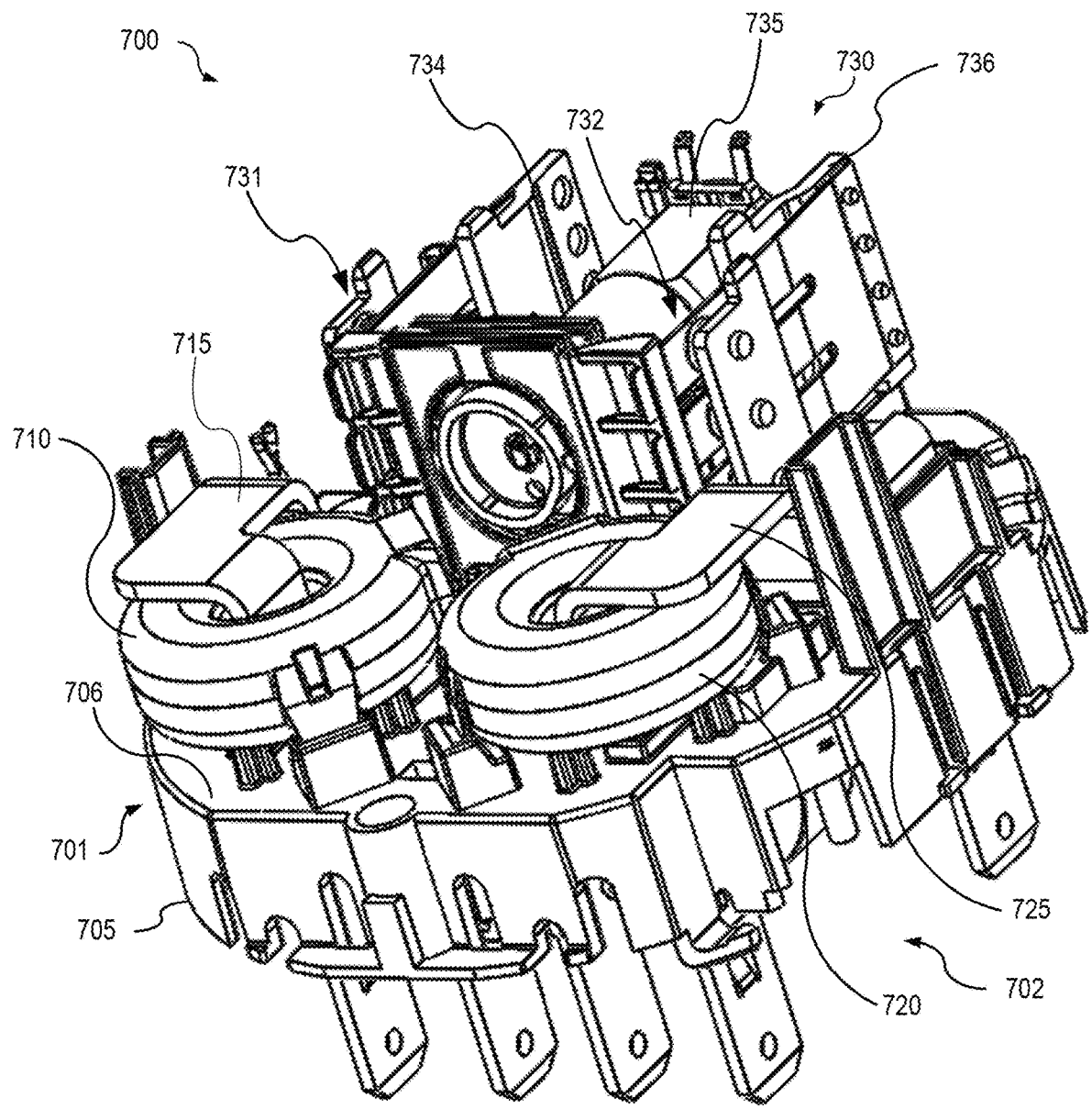
FIG. 7A is a top perspective view of an example of an internal electrical assembly of a DER meter in accordance with various aspects of the present disclosure.
Figure 7B:
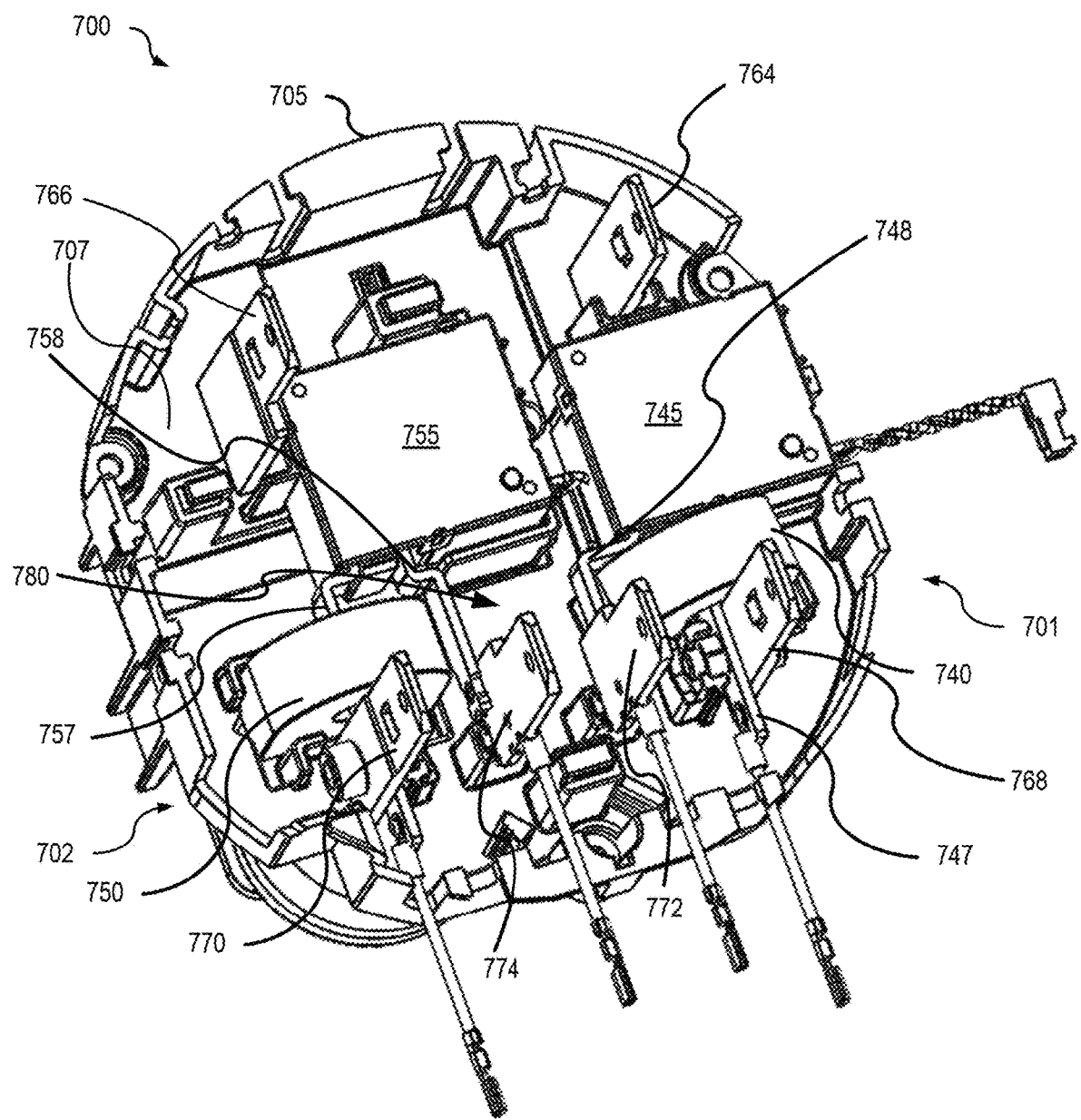
FIG. 7B is a bottom perspective view of the example of the internal electrical assembly of a DER meter in accordance with various aspects of the present disclosure.

Referring to FIGS. 7A and 7B, the blade portion 602 of the DER meter 102 may be located on a baseplate 810 (see FIG. 8) and electrically coupled with an L1(Line) busbar 734, an L2(Line) busbar 736, an L1(Load) busbar 715, an L2(Load) busbar 725, an L1(DER) busbar 748, and an L2(DER) busbar 758.

FIG. 7A is a top perspective view of an example of an internal electrical assembly 700 of a DER meter according to some aspects of the present disclosure. Referring to FIG. 7A, the internal electrical assembly 700 may include a support structure 705, a first current transducer 710 (e.g., the L1(Line) current transducer 114a in FIG. 1), a first busbar 715, a second current transducer 720 (e.g., the L2(Line) current transducer 114b in FIG. 1), a second busbar 725, a line disconnect switch assembly 730, a third busbar 734, and a fourth busbar 736.

The first current transducer 710 and the first busbar 715 may be mounted on a first (e.g., top) surface 706 of the support structure 705 on a first (e.g., left) side 701 of the internal electrical assembly 700. Similarly, the second current transducer 720 and the second busbar 725 may be mounted on the first (e.g., top) surface 706 of the support structure 705 on a second (e.g., right) side 702 of the internal electrical assembly 700. The first surface 706 of the support structure 705 may be substantially parallel to the blade portion 602 of the DER meter 102. The first and second sides 701, 702 of the internal electrical assembly 700 may be non-overlapping.

FIG. 7B is a bottom perspective view of the example of the internal electrical assembly 700 of a DER meter according to some aspects of the present disclosure. Referring to FIG. 7B, the internal electrical assembly 700 may further include a third current transducer 740 (e.g., the L1(DER) current transducer 114e), a first disconnect switch 745, e.g., the L1(DER) disconnect switch, a fifth busbar 747, a sixth busbar 748, a fourth current transducer 750 (e.g., the L2(DER) current transducer 114f), a second disconnect switch 755 e.g., the L2(DER) disconnect switch, a seventh busbar 757, and an eighth busbar 758.

The third current transducer 740, the fifth busbar 747, and the sixth busbar 748 may be mounted on a second (e.g., bottom) surface 707 of the support structure 705 on the first (e.g., left) side 701 of the internal electrical assembly 700. Similarly, the fourth current transducer 750, the seventh busbar 757, and the eighth busbar 758 may be mounted on the second (e.g., bottom) surface 707 of the support structure 705 on the second (e.g., right) side 702 of the internal electrical assembly 700. The second surface 707 of the support structure 705 may be substantially parallel to the first surface 706 of the support structure 705.

The third current transducer 740, the fifth busbar 747, and the sixth busbar 748 may be mounted on the second (e.g., bottom) surface 707 of the support structure 705 substantially beneath the first current transducer 710 and the first busbar 715 mounted on the first (e.g., top) surface 706 of the support structure 705. The fourth current transducer 750, the seventh busbar 757, and the eighth busbar 758 may be mounted on the second (e.g., bottom) surface 707 of the support structure 705 substantially beneath the second current transducer 720 and the second busbar 725 mounted on the first (e.g., top) surface 706 of the support structure 705. Thus, the DER meter 102 provides a design with the L1 conductors on a left side 701 of the internal electrical assembly 700 of the DER meter and the L2 conductors on a right side 702 of the internal electrical assembly 700 of the DER meter. In some cases, the L1 conductors and the L2 conductors may be symmetrically arranged on the left side 701 of the internal electrical assembly 700 and the right side 702 of the internal electrical assembly 700, respectively.

The first busbar 715 may terminate with the blade portion 768 extending from the support structure 705 and corresponding to the blade portion 608 in FIG. 6. The second busbar 725 may terminate with the blade portion 770 extending from the support structure 705 and corresponding to the blade portion 610 in FIG. 6. The third busbar 734 may terminate with the blade portion 764 extending from the support structure 705 and corresponding to the blade portion 604 in FIG. 6. The fourth busbar 736 may terminate with the blade portion 766 extending from the support structure 705 and corresponding to the blade portion 606 in FIG. 6.

The fifth busbar 747 may electrically connect the first disconnect switch 745 to the first busbar 715. The sixth busbar 748 may electrically connect the first disconnect switch 745 to the blade portion 772 extending from the support structure 705 and corresponding to the blade portion 611 in FIG. 6. The seventh busbar 757 may electrically connect the second disconnect switch 755 to the second busbar 725. The eighth busbar 758 may electrically connect the second disconnect switch 755 to the blade portion 774 extending from the support structure 705 and corresponding to the blade portion 614 in FIG. 6.

With reference to FIG. 1, the first busbar 715 may be the L1(Load) busbar and may be referred to herein as the L1(Load) busbar 715. The second busbar 725 may be the L2(Load) busbar and may be referred to herein as the L2(Load) busbar 725. The third busbar 734 may be the L1(Line) busbar and may be referred to as the L1(Line) busbar 734. The fourth busbar 736 may be the L2(Line) busbar and may be referred to as the L2(Line) busbar 736. The fifth busbar 747 may be the L1(DER_Load) busbar and may be referred to herein as the L1(DER_Load) busbar 747. The sixth busbar 748 may be the L1(DER) busbar and may be referred to herein as the L1(DER) busbar 748. The seventh busbar 757 may be the L2(DER_Load) busbar and may be referred to herein as the L2(DER_Load) busbar 757. The eighth busbar 758 may be the L2(DER) busbar and may be referred to herein as the L2(DER) busbar 758.

The first current transducer 710 may be an L1(Line) current transducer. For example, the first current transducer 710 may be the L1(Line) current transducer 114a in FIG. 1. The first current transducer 710 may be referred to herein as the L1(Line) current transducer 710. The L1(Line) current transducer 710 may be positioned around the L1(Load) busbar 715 and may be used to measure the L1(Line) current supplied to the load.

The second current transducer 720 may be an L2(Line) current transducer. For example, the second current transducer 720 may be the L2(Line) current transducer 114b in FIG. 1. The second current transducer 720 may be referred to herein as the L2(Line) current transducer 720. The L2(Line) current transducer 720 may be positioned around the L2(Load) busbar 725 and may be used to measure the L2(Line) current supplied to the load.

The line disconnect switch assembly 730 may be, for example, the line disconnect switch 122 in FIG. 1. The line disconnect switch assembly 730 may be motor driven. That is, a motor 735 may mechanically drive contacts 731, 732 of line disconnect switch assembly 730 to an open position or a closed position. The L1(Load) busbar 715 may be electrically connected to the third busbar 734 (the L1(Line) busbar 734) via the contacts 731 of the line disconnect switch assembly 730 when the contacts 731 are in the closed position. Similarly, the L2(Load) busbar 725 may be electrically connected to the fourth busbar 736 (the L2(Line) busbar 736) via the contacts 732 of the line disconnect switch assembly 730 when the contacts 732 are in the closed position.

The third current transducer 740 may be an L1(DER) current transducer 740. For example, the third current transducer 740 may be the L1(DER) current transducer 114e in FIG. 1. The third current transducer 740 may be referred to herein as the L1(DER) current transducer 740. The L1(DER) current transducer 740 may be positioned around the L1(DER_Load) busbar 747 and may be used to measure the L1(DER) current.

The fourth current transducer 750 may be an L2(DER) current transducer 750. For example, the fourth current transducer 750 may be the L2(DER) current transducer 114f in FIG. 1. The fourth current transducer 750 may be referred to herein as the L2(DER) current transducer 750. The L2(DER) current transducer 750 may be positioned around the L2(DER_Load) busbar 757 and may be used to measure the L2(DER) current.

The first disconnect switch 745 may be positioned along a path of the L1(DER_Load) busbar 747. The second disconnect switch 755 may be positioned along a path of the L2(DER_Load) busbar 757. The disconnect switches 745 and 755 may be controllable electrical disconnect switches, such as the controllable electrical disconnect switch 124 of FIG. 1. In an example, the disconnect switches 745 and 755 may disconnect the DER device 116 from the DER meter 102 upon occurrence of an electrical fault. Additionally, the disconnect switches 745 and 755 may be controlled locally or remotely using a controller (not shown) on the PCB assembly, for example, the PCB assembly 1160 in FIG. 11.

As illustrated in FIG. 7B, an air gap 780 may be maintained between exposed (e.g., not electrically insulated) L1 components 748, 772 and exposed L2 components 774, 758 to provide isolation between the L1 components 748, 772 and the L2 components 774, 758. The internal electrical assembly 700 of the DER meter provides a design with the L1 conductors on a first side 701 of the internal electrical assembly 700 and the L2 conductors on a second side 702 of the internal electrical assembly 700, where the first side 701 is shown on a right side of FIG. 7B and the second side 702 is shown on a left side of FIG. 7B. In some cases, the L1 conductors and the L2 conductors may be symmetrically arranged on the first side 701 of the internal electrical assembly 700 and the second side 702 of the internal electrical assembly 700, respectively. The air gap 780 may isolate the L1 conductors on the first side 701 of the internal electrical assembly 700 from the L2 conductors on the second side 702 of the internal electrical assembly 700. In an example, any exposed (e.g., not electrically insulated) conductors may be separated by the air gap 780 in a range of 12 mm-18 mm.

Figure 8:
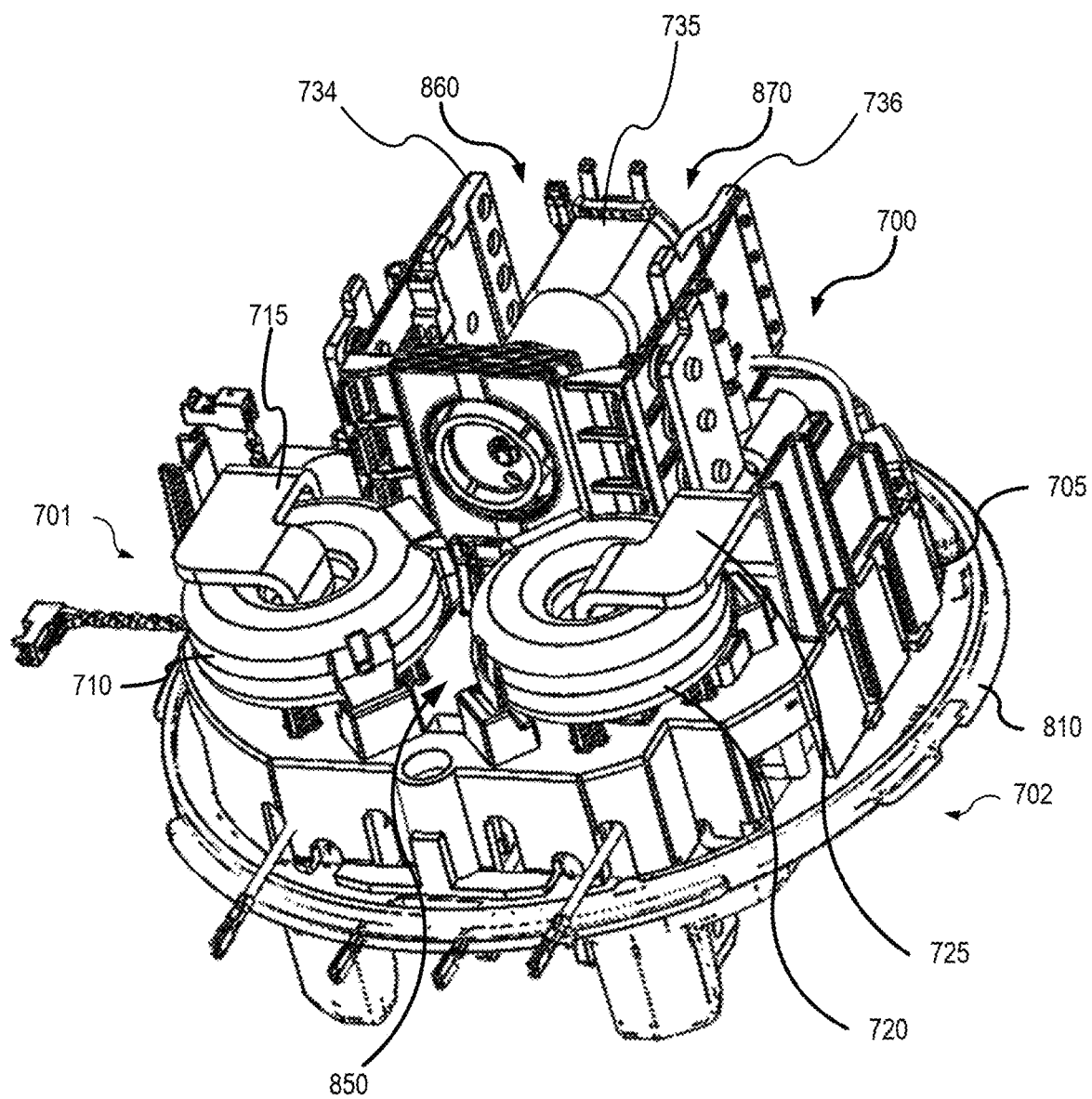
FIG. 8 is a perspective view of an example of an internal electrical assembly illustrated in FIGS. 7A and 7B mounted on a baseplate in accordance with various aspects of the present disclosure.

FIG. 8 is a perspective view of an example of the internal electrical assembly 700 illustrated in FIGS. 7A and 7B mounted on a baseplate 810 in accordance with various aspects of the present disclosure. The internal electrical assembly 800 may be the internal electrical assembly 700 illustrated in FIGS. 7A and 7B. As illustrated in FIG. 8, the support structure 705 of the internal electrical assembly 700 may be mechanically coupled to a baseplate 810 of the DER meter. The blade portions of the internal electrical assembly may extend through the baseplate 810 to facilitate electrical connections with a meter socket.

As illustrated, an air gap 850 may be maintained between exposed (e.g., not electrically insulated) L1 components, e.g., the L1(Line) current transducer 710 and the L1(Load) busbar 715 and exposed L2 components, e.g., the L2(Line) current transducer 720 and the L2(Load) busbar 725 of the DER meter 102 to provide isolation between the L1 components and the L2 components. In an example, the air gap 888 may be maintained at a distance greater than 12 mm. In examples where the air gap 888 is smaller than 12 mm, the air gap 888 may be supplemented by the addition of a plastic layer or other physical boundary layer of electrically isolating material (not shown) to further isolate the L1 components 710, 715 from the L2 components 720, 725.

The internal electrical assembly 700 of the DER meter provides a design with the L1 conductors on a first side 701 of the internal electrical assembly 700 and the L2 conductors on a second side 702 of the internal electrical assembly 700, where the first side 701 is shown on the left side of FIG. 8 and the second side 702 is shown on the right side of FIG. 8. In some cases, the L1 conductors and the L2 conductors may be symmetrically arranged on the first side 701 of the internal electrical assembly 700 and the second side 702 of the internal electrical assembly 700, respectively. The air gap 850 may isolate the L1 conductors on the first side 701 of the internal electrical assembly 700 from the L2 conductors on the second side 702 of the internal electrical assembly 700. In an example, any exposed (e.g., not electrically insulated) conductors may be separated by the air gap 850 in a range of 12 mm-18 mm. In addition, an air gap 860 of at least 10 mm may be provided between the L1(Line) busbar 734 and the motor 735, and an air gap 870 of at least 10 mm may be provided between the L2(Line) busbar 736 and the motor 735.

Figure 9:
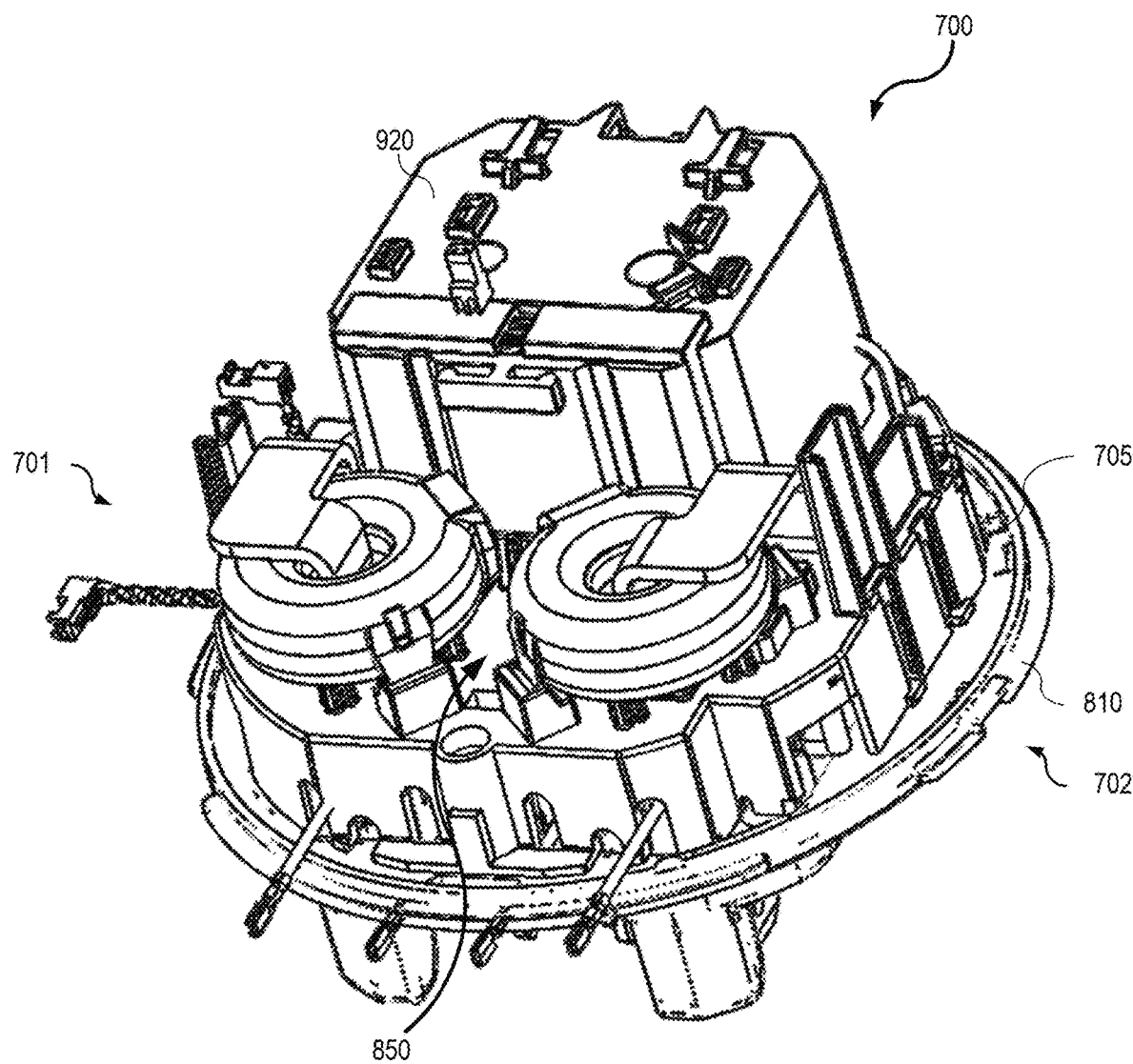
FIG. 9 is a perspective view of an example of an internal electrical assembly of a DER meter including an isolation cover mounted on the baseplate in accordance with various aspects of the present disclosure.

FIG. 9 is a perspective view of an example of an internal electrical assembly 700 of a DER meter including an isolation cover 920 mounted on a baseplate 810 in accordance with various aspects of the present disclosure. As illustrated in FIG. 9, the isolation cover 920 may fit over the busbars 734, 736 and the line disconnect switch assembly 730. The isolation cover 920 may be a plastic cover and may provide electrical isolation between the printed circuit board (PCB) assembly 1160 (see FIG. 11) as well as protection for the busbars 734, 736 and the line disconnect switch assembly 730.

Figure 10:
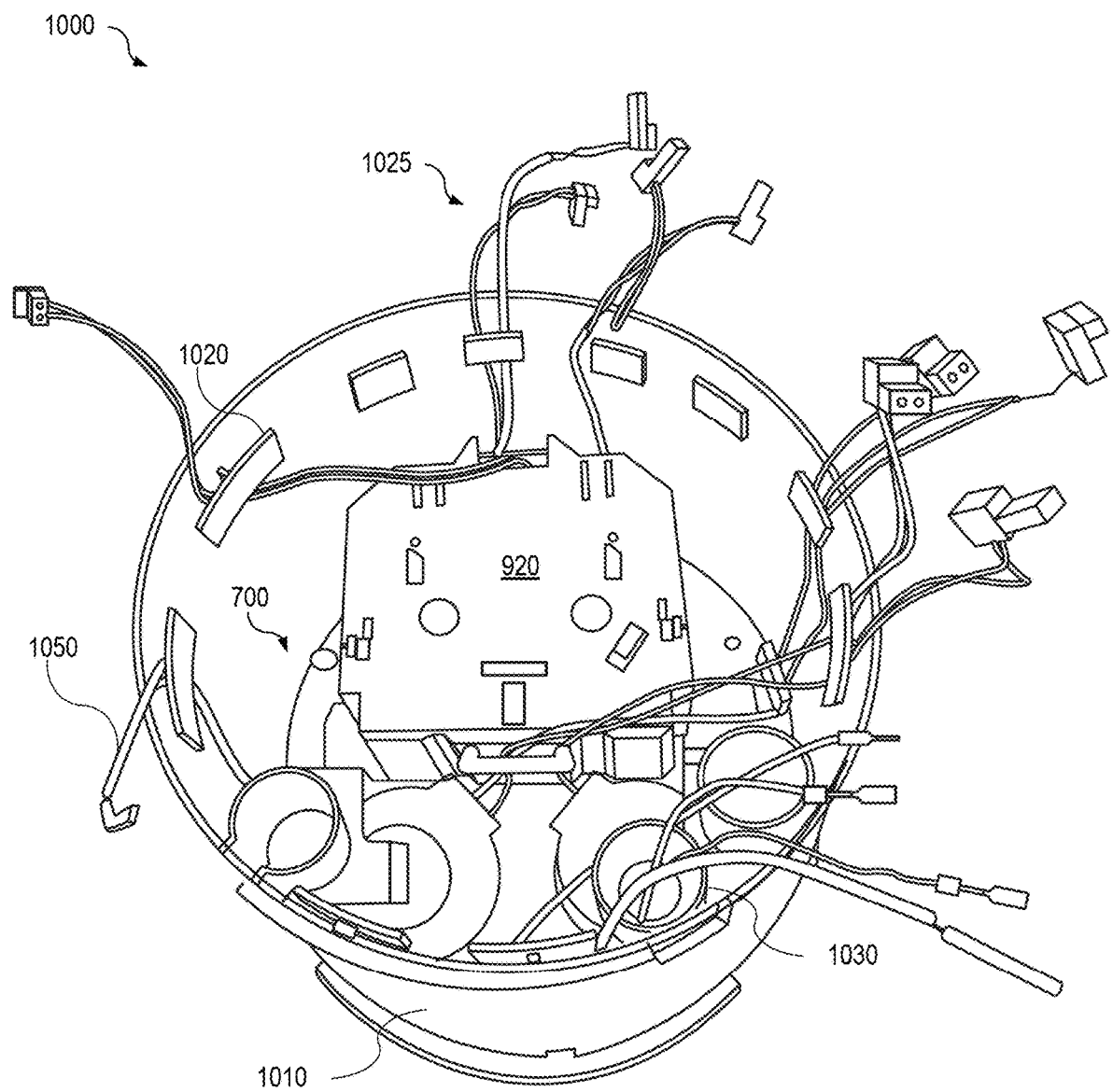
FIG. 10 is a perspective view of a DER meter illustrating an example of a first portion of an inner cover in accordance with various aspects of the present disclosure.

FIG. 10 is a perspective view of a DER meter 1000 illustrating an example of a first portion of an inner cover 1010 in accordance with various aspects of the present disclosure. The first portion of the inner cover 1010 may be substantially cylindrical and may be positioned surrounding the inner components 1015 of the DER meter 1000. The inner components 1015 may include the internal electrical assembly 700 including the isolation cover 920. In an example, the inner cover 1010 may be an opaque plastic cover. The first portion of the inner cover 1010 may include cleats 1020 and guides 1030 configured to retain wire leads 1025 extending from the internal electrical assembly 700 to form electrical connection to a PCB assembly 1160 (see FIG. 11).

Figure 11:
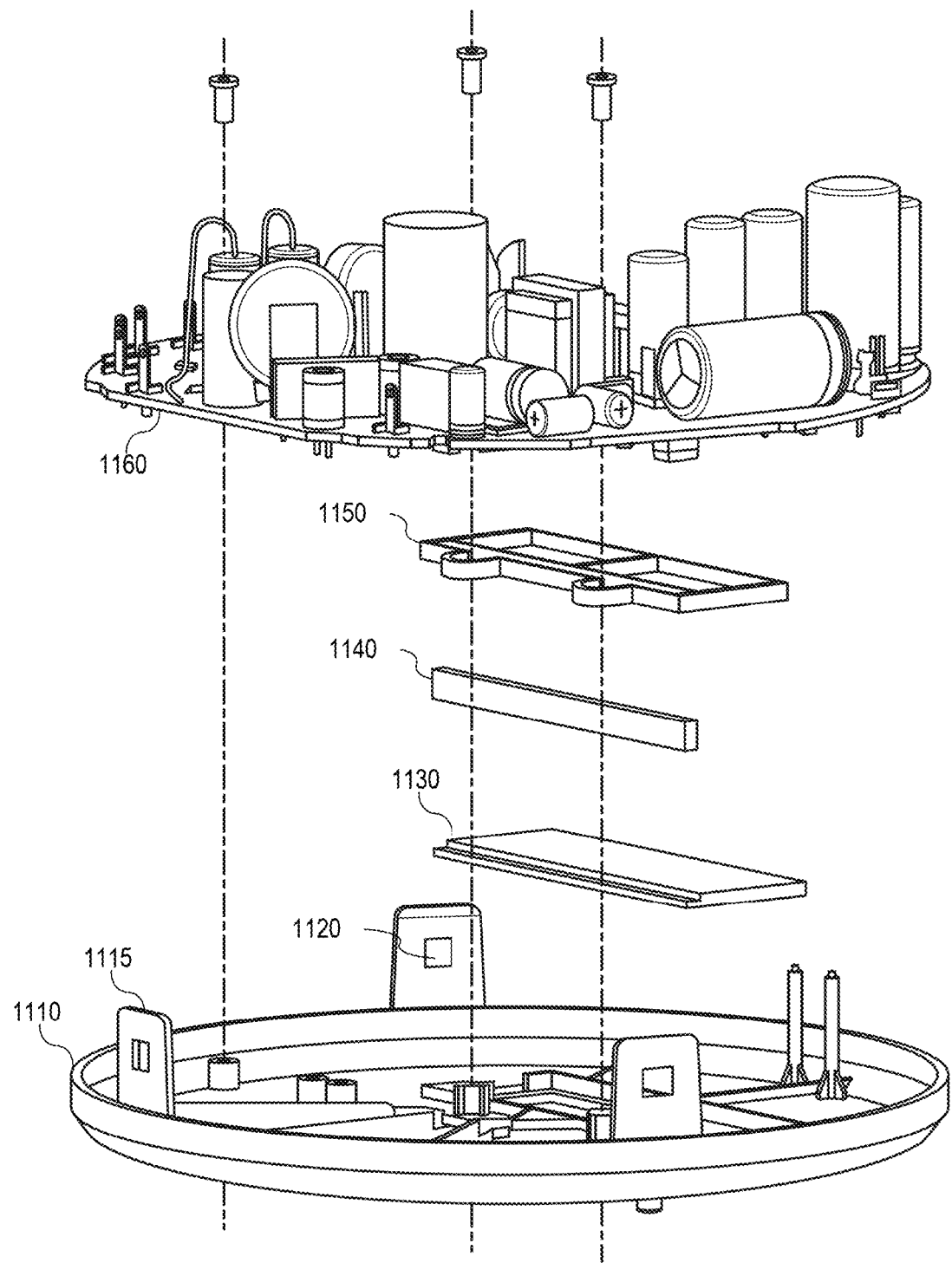
FIG. 11 is a perspective view illustrating an example of a top portion of an inner cover and a PCB of a DER meter in accordance with various aspects of the present disclosure.

FIG. 11 is a perspective view illustrating an example of a top portion of an inner cover 1110 and a PCB assembly 1160 of a DER meter in accordance with various aspects of the present disclosure. The top portion of an inner cover 1110 may be substantially circular and may include tabs 1115 having slots 1120 to engage corresponding pins 1210 (see FIG. 12) disposed on the circumference of the first portion of the inner cover 1010 to retain the top portion of an inner cover 1110 to the first portion of the inner cover 1010. The top portion of the inner cover 1110 may close the top opening of the first portion of the inner cover 1010. In an example, the top portion of the inner cover 1110 may be an opaque plastic cover.

A liquid crystal display 1130 or other display may be mounted to the top portion of the inner cover 1110 with a display holder 1150 configured to retain the LCD display 1130 to the top portion of an inner cover 1110. An elastomeric connector 1140 may provide an electrical connection between the LCD display 1130 and the PCB assembly 1160. The PCB assembly 1160 may be mounted to the top portion of an inner cover 1110. Prior to attaching the top portion of the inner cover 1110 to the first portion of an inner cover 1010, the wire leads 1025 extending from the internal electrical assembly 1015 may be connected to connection points (not shown) on the PCB assembly 1160.

In an example, the PCB assembly 1160 may include a controller (not shown) that is able to control operation of the line disconnect switch assembly 730, the L1 DER disconnect switch 745, the L2 DER disconnect switch 755, or any combination thereof. The PCB assembly 1160 may also include a communications module (not shown) that provides communication between the DER meter 102 and the DER device 116. In some examples, the communications module may also provide communication with a mesh network of other metering devices, with other IoT devices, or any combination thereof.

Figure 12:
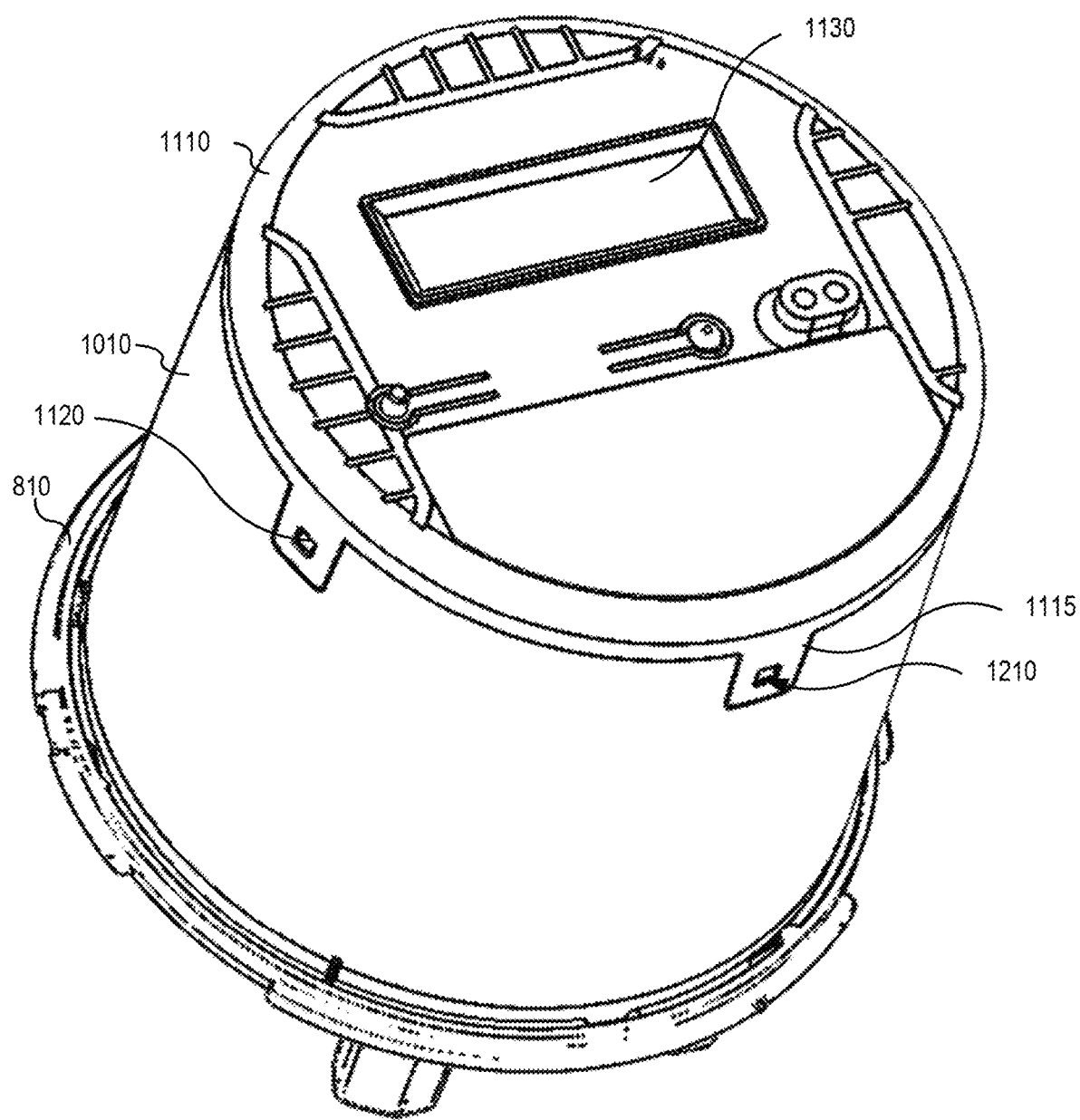
FIG. 12 is a perspective view illustrating an example of a first portion of an inner cover and a top portion of the inner cover assembled on a baseplate of a DER meter.

FIG. 12 is a perspective view illustrating an example of a first portion of an inner cover 1010 and a top portion of the inner cover 1110 assembled on a baseplate 810 of a DER meter in accordance with various aspects of the present disclosure. As illustrated in FIG. 12, pins 1210 disposed on the circumference of the first portion of the inner cover 1010 corresponding to the slots 1120 in the tabs 1115 of the top portion of the inner cover 1110 may retain the top portion of an inner cover 1110 to the first portion of the inner cover 1010.

Figure 13:
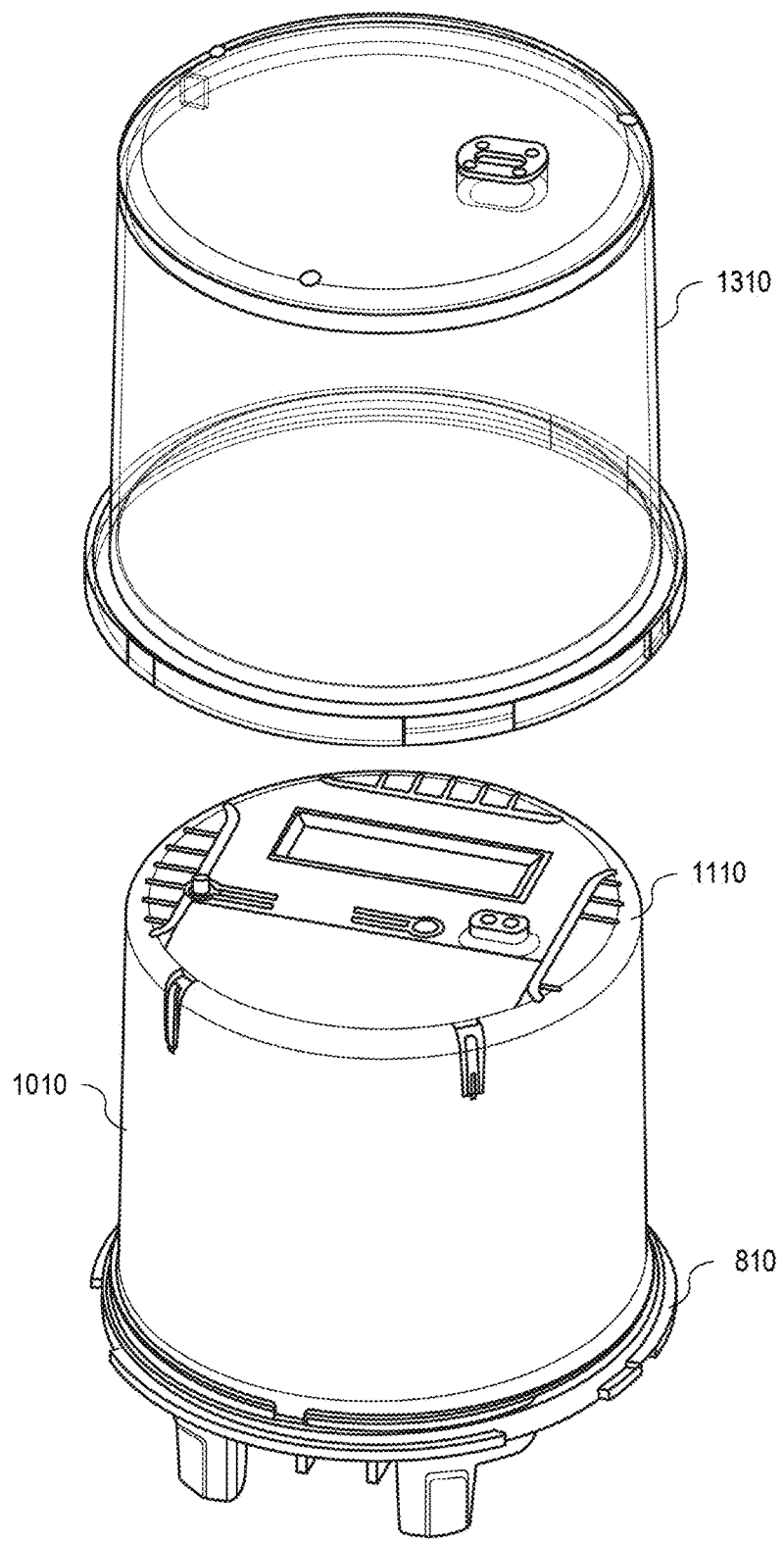
FIG. 13 is perspective view of an example of an outer cover for a DER meter in accordance with various aspects of the present disclosure in accordance with various aspects of the present disclosure.

FIG. 13 is perspective view of an example of an outer cover 1310 for a DER meter in accordance with various aspects of the present disclosure. As illustrated in FIG. 13, the outer cover 1310 may be configured to be positioned around the first portion of the inner cover 1010 and the top portion of the inner cover 1110. The outer cover 1310 may be a transparent plastic cover.

Figure 14:
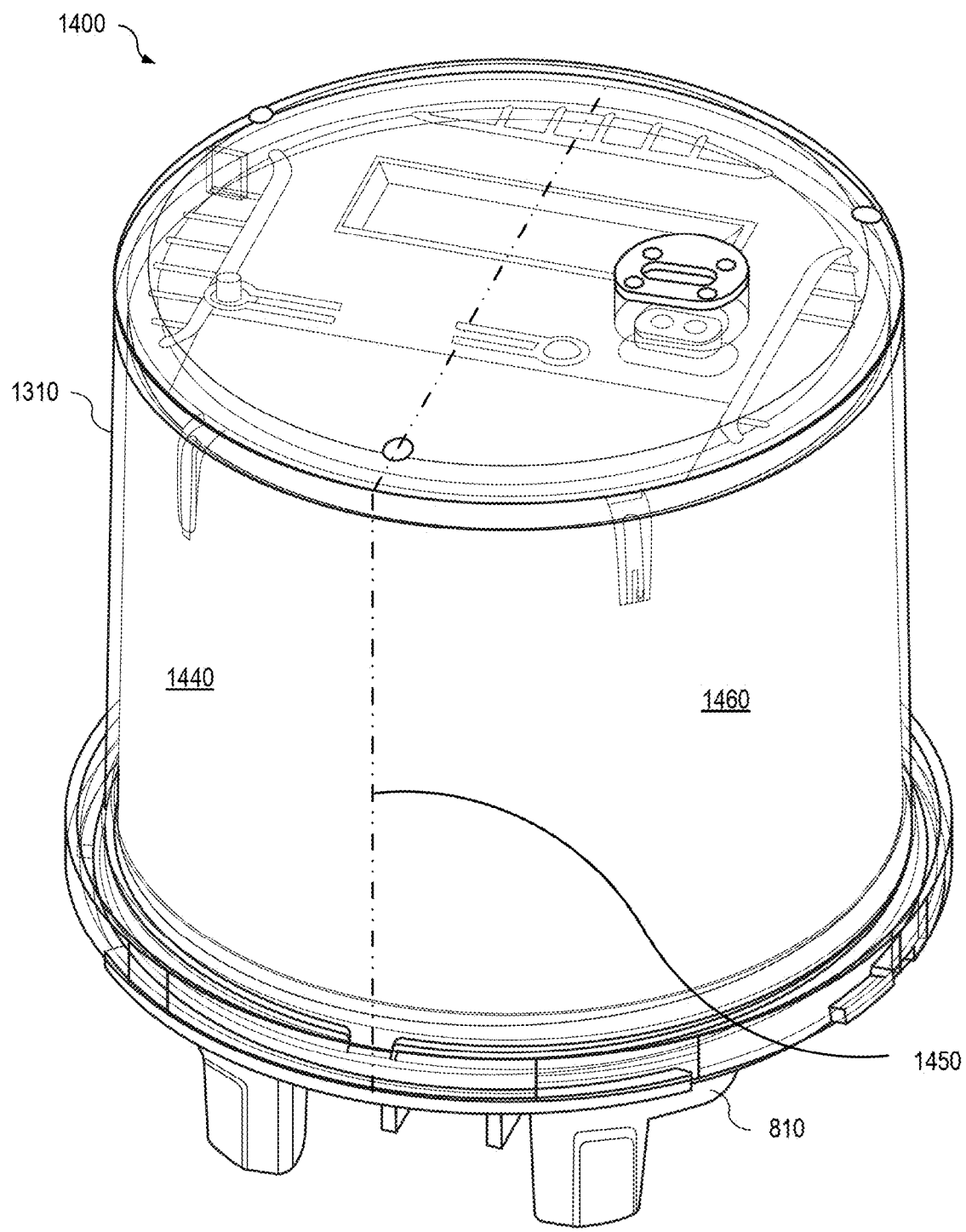
FIG. 14 is a perspective view illustrating an example of a DER meter having the outer cover assembled to the baseplate in accordance with various aspects of the present disclosure.

FIG. 14 is a perspective view illustrating an example of a DER meter 1400 having the outer cover assembled to the baseplate 810 in accordance with various aspects of the present disclosure. The outer cover 1310 may be made from a transparent, plastic material. The transparent material of the outer cover 1310 may enable viewing of the LCD display 1130. The LCD display 1130 may visually display information about the DER meter 102. For example, the display 1130 may provide an indication of kilowatt hours consumed over a specified time period, such as a billing cycle.

In an example, the outer cover 1310, or housing, may be generally cylindrical in shape or shaped like a conical frustum (e.g., with sides sloping toward a common point away from the baseplate 810). The outer cover 1310 may be considered to form two semicylinders. Referring to FIG. 14, a first semicylinder 1440 may be formed by a left side of the outer cover 1310 and a second semicylinder 1460 that is different from the first semicylinder 1440 may be formed by a right side of the outer cover 1310. The first semicylinder 1440 and the second semicylinder 1460 are nonoverlapping. In FIG. 14 the first semicylinder 1440 and the second semicylinder 1460 may be demarcated by the imaginary line 1450. The left side 701 of the internal electrical assembly 700 of the DER meter may be positioned within the first semicylinder 1440 of the outer cover 1310. Similarly, the right side 702 of the internal electrical assembly 700 of the DER meter 102 may be positioned within the second semicylinder 1460 of the outer cover 1310.

The DER meter 102 provides a design with the L1 conductors on a left side 701 of the internal electrical assembly 700 of the DER meter and the L2 conductors on a right side 702 of the internal electrical assembly 700 of the DER meter. In some cases, the L1 conductors and the L2 conductors may be symmetrically arranged on the left side 701 of the internal electrical assembly 700 and the right side 702 of the internal electrical assembly 700, respectively. The L1(Line) current transducer 710 and the L1(DER) current transducer 740 are each located on the left side 701 of the internal electrical assembly 700 of the DER meter 102. As illustrated, the left side 701 of the internal electrical assembly 700 is associated with the L1 conductors. Similarly, the L2(Line) current transducer 720 and the L2(DER) current transducer 750 are each located on the right side 702 of the internal electrical assembly 700. As illustrated, the right side 702 of the internal electrical assembly 700 is associated with the L2 conductors.

The DER meter 102 may support billable grade metrology on the line, load, and DER ports and provide a bi-directional metering point on each of the three ports. As used herein, the term billable grade metrology may refer to a metrology system that is capable of performing metering operations to provide measurements of the amount of energy provided by the DER device 116 to the premises or the grid 108, as well as the time when the energy is provided.

The DER meter 102 eliminates the need for a spacing device, for example, a collar, installed between the DER meter 102 and the socket 200 that supports metrology of a (e.g., the DER device 116). Because the DER meter 102 does not require a collar installed between the DER meter 102 and the socket 200, the distance that the DER meter 102 extends from the socket 200 may be much shorter than a distance that a combination of a collar and a standard metering device would extend from the socket 200. For example, the collar and metering device may extend three or more inches further outward from the socket 200 than the DER meter 102 according to the present disclosure. In addition, the DER meter 102 may extend from the socket approximately 5.5 inches compared to approximately 6.5 inches for a typical electricity meter, thus enabling the DER meter to fit within a smaller enclosure.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. An electricity meter, comprising:
   a first set of connection paths configured to couple to a meter socket and electrically coupled to a first electrical connection path between a first phase of an electric distribution power source, a first phase of a distributed energy resource (DER) device, and a first phase of a load, wherein the first electrical connection path includes first electrical metrology components; and
   a second set of connection paths configured to couple to the meter socket and electrically coupled to a second electrical connection path between a second phase of the electric distribution power source, a second phase of the DER device, and a second phase of the load, wherein the second electrical connection path includes second electrical metrology components,
   wherein the first electrical metrology components and the second electrical metrology components are arranged in the electricity meter such that:
   at least one of the first electrical metrology components is positioned on a first surface of a support structure on a first side of the electricity meter and at least one other of the first electrical metrology components is positioned on a second surface of the support structure opposite the first surface on the first side of the electricity meter, and
   at least one of the second electrical metrology components is positioned on the first surface of the support structure on a second side of the electricity meter and at least one other of the second electrical metrology components is positioned on the second surface of the support structure opposite the first surface on the second side of the electricity meter,
   wherein the second side of the electricity meter is non-overlapping with the first side of the electricity meter.

2. The electricity meter of claim 1, wherein the first electrical metrology components and the second electrical metrology components are symmetrically arranged on the first side of the electricity meter and the second side of the electricity meter, respectively.

3. The electricity meter of claim 1, wherein the first electrical metrology components include at least one first component that is not electrically insulated and the second electrical metrology components include at least one second component that is not electrically insulated, and an air gap separates the at least one first component from the at least one second component.

4. The electricity meter of claim 1, wherein the first electrical metrology components comprise a first set of busbars and a first set of current transducers and the second electrical metrology components comprise a second set of busbars and a second set of current transducers.

5. The electricity meter of claim 1, wherein the first electrical metrology components and the second electrical metrology components are separated with an air gap, a physical boundary layer, or a combination of an air gap and a physical boundary layer.

6. The electricity meter of claim 1, wherein the first electrical metrology components comprise a first set of current transducers configured to monitor current on the first phase of the electric distribution power source and the first phase of the DER device, and wherein the second electrical metrology components comprise a second set of current transducers configured to monitor current on the second phase of the electric distribution power source and the second phase of the DER device.

7. The electricity meter of claim 1, wherein the first electrical metrology components are disposed on the first side of the electricity meter and include at least one first line busbar interconnected to a first load busbar and a first DER busbar, and the second electrical metrology components are disposed on the second side of the electricity meter and include at least one second line busbar interconnected to a second load busbar and a second DER busbar.

8. The electricity meter of claim 1, further comprising a set of mating connectors, wherein each mating connector is electrically coupled to a connection path of the first set of connection paths, the second set of connection paths, or a neutral connection path.

9. The electricity meter of claim 8, wherein the set of mating connectors are installable within a 14S meter socket, a 15S meter socket, a 16S meter socket, or a 43S socket.

10. An electricity meter, comprising:
    a plurality of first electrical metrology components including a first load busbar, a first line current transducer positioned around the first load busbar, a first DER busbar, and a first DER current transducer positioned around the first DER busbar;
    a plurality of second electrical metrology components including a second load busbar, a second line current transducer positioned around the second load busbar, a second DER busbar, and a second DER current transducer positioned around the second DER busbar; and
    a support structure configured to mount the plurality of first electrical metrology components and the plurality of second electrical metrology components, the support structure having a first surface and a second surface opposite the first surface,
    wherein at least one of the first electrical metrology components and at least one of the second electrical metrology components are positioned on the first surface of the support structure, and at least one other of the first electrical metrology components and at least one other of the second electrical metrology components are positioned on the second surface of the support structure opposite the first surface,
wherein the first electrical metrology components and the second electrical metrology components are arranged in the electricity meter so that the first electrical metrology components are positioned on a first side of the electricity meter and the second electrical metrology components are positioned on a second side of the electricity meter that is non-overlapping with the first side of the electricity meter.

11. The electricity meter of claim 10, wherein the first electrical metrology components and the second electrical metrology components are symmetrically arranged on the first side of the electricity meter and the second side of the electricity meter, respectively.

12. The electricity meter of claim 10, wherein a first electrical connection path includes a first line busbar, the first DER busbar, the first load busbar, and a first DER disconnect switch, and a second electrical connection path includes a second line busbar, the second DER busbar, the second load busbar, and a second DER disconnect switch.

13. The electricity meter of claim 10, wherein the first electrical metrology components are disposed on the first side of the electricity meter and include at least one first line busbar interconnected to a first load busbar and a first DER busbar, and the second electrical metrology components are disposed on the second side of the electricity meter and include at least one second line busbar interconnected to a second load busbar and a second DER busbar.

14. The electricity meter of claim 10, wherein the first electrical metrology components and the second electrical metrology components of the electricity meter are separated with an air gap, a physical boundary layer, or a combination of an air gap and a physical boundary layer.

15. The electricity meter of claim 10, wherein the electricity meter further comprises a set of mating connectors that comprises:
a first line mating connector connected to a first line busbar;
a second line mating connector connected to a second line busbar;
a first DER mating connector connected to the first DER busbar;
a second DER mating connector connected to the second DER busbar;
a first load mating connector connected to the first load busbar;
a second load mating connector connected to the second load busbar; and
a neutral load mating connector connected to a voltage measurement circuit of the electricity meter.

16. The electricity meter of claim 15, wherein the set of mating connectors are installable within a 14S meter socket, a 15S meter socket, a 16S meter socket, or a 43S socket.

17. An electricity meter comprising:
a first electrical connection path that connects a first line mating connector, a first DER mating connector, and a first load mating connector, wherein the first electrical connection path includes a plurality of first electrical metrology components including a first line busbar, a first load busbar coupled to the first line busbar, a first line current transducer positioned around the first load busbar, a first DER busbar, and a first DER current transducer positioned around the first DER busbar; and
a second electrical connection path that connects a second line mating connector, a second DER mating connector, and a second load mating connector, wherein the second electrical connection path includes a plurality of second electrical metrology components including a second line busbar, a second load busbar coupled to the second line busbar, a second line current transducer positioned around the second load busbar, a second DER busbar, and a second DER current transducer positioned around the second DER busbar,
wherein at least one of the first electrical metrology components and at least one of the second electrical metrology components are positioned on a first surface of a support structure, and at least one other of the first electrical metrology components and at least one other of the second electrical metrology components are positioned on a second surface of the support structure opposite the first surface, and
wherein the first electrical metrology components and the second electrical metrology components are arranged in the electricity meter so that the first electrical metrology components are positioned on a first side of the electricity meter and the second electrical metrology components are positioned on a second side of the electricity meter that is non-overlapping with the first side of the electricity meter.

18. The electricity meter of claim 17, wherein the first electrical metrology components and the second electrical metrology components are symmetrically arranged on the first side of the electricity meter and the second side of the electricity meter, respectively.

19. The electricity meter of claim 17, further comprising:
at least one neutral connection path that connects a neutral mating connector to a voltage measurement circuit of the electricity meter.

20. The electricity meter of claim 17, wherein the first electrical metrology components are disposed on the first side of the electricity meter and include at least one first line busbar interconnected to a first load busbar and a first DER busbar, and the second electrical metrology components are disposed on the second side of the electricity meter and include at least one second line busbar interconnected to a second load busbar and a second DER busbar.

21. The electricity meter of claim 17, wherein the first electrical metrology components and the second electrical metrology components are separated with an air gap, a physical boundary layer, or a combination of both.

22. The electricity meter of claim 17, wherein the first electrical connection path includes a first DER disconnect switch, and the second electrical connection path a second DER disconnect switch.

23. The electricity meter of claim 17, wherein the first line mating connector, the first DER mating connector, the first load mating connector, the second line mating connector, the second DER mating connector, and the second load mating connector are installable within a 14S meter socket, a 15S meter socket, a 16S meter socket, or a 43S socket.

* * * * *